(12) United States Patent
Smyth et al.

(10) Patent No.: US 11,871,674 B1
(45) Date of Patent: Jan. 9, 2024

(54) INTEGRATED MULTILAYER ACTUATORS

(71) Applicant: META PLATFORMS TECHNOLOGIES, LLC, Menlo Park, CA (US)

(72) Inventors: Katherine Marie Smyth, Seattle, WA (US); Spencer Alan Wells, Seattle, WA (US); Amir Peyman Delparastan, Redmond, WA (US); Andrew John Ouderkirk, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 650 days.

(21) Appl. No.: 16/594,348

(22) Filed: Oct. 7, 2019

(51) Int. Cl.
| | |
|---|---|
| *G02B 1/111* | (2015.01) |
| *G02B 1/116* | (2015.01) |
| *H10N 30/20* | (2023.01) |
| *G02B 27/01* | (2006.01) |
| *G02B 1/115* | (2015.01) |
| *G02B 26/00* | (2006.01) |
| *H10N 30/02* | (2023.01) |
| *H10N 30/06* | (2023.01) |
| *H10N 30/073* | (2023.01) |

(Continued)

(52) U.S. Cl.
CPC ........... *H10N 30/204* (2023.02); *G02B 1/115* (2013.01); *G02B 26/004* (2013.01); *G02B 27/0176* (2013.01); *H10N 30/02* (2023.02); *H10N 30/06* (2023.02); *H10N 30/073* (2023.02); *H10N 30/086* (2023.02); *H10N 30/097* (2023.02); *H10N 30/8548* (2023.02); *H10N 30/8554* (2023.02); *H10N 30/878* (2023.02); *H10N 30/883* (2023.02); *G02B 2027/0178* (2013.01)

(58) Field of Classification Search
CPC ......... H01L 41/23; H01L 41/29; H01L 41/43; H01L 41/313; H01L 41/337; H01L 41/0478; H01L 41/0533; H01L 41/0926; H01L 41/1875; H01L 41/1876; G02B 1/115; G02B 26/004; G02B 27/0176; G02B 2027/0178
USPC ....................................................... 310/330
See application file for complete search history.

(56) References Cited

U.S. PATENT DOCUMENTS

| | | | |
|---|---|---|---|
| 2010/0013799 A1* | 1/2010 | Kim ........................ | G06F 3/043 345/177 |
| 2019/0132948 A1* | 5/2019 | Longinotti-Buitoni ..................... | D06P 1/5285 |

(Continued)

OTHER PUBLICATIONS

Jiang et al., "Transparent Electro-Optic Ceramics and Devices", URL: http://www.bostonati.com/whitepapers/SPIE04paper, as accessed on Aug. 15, 2019, 15 pages.

(Continued)

*Primary Examiner* — Shawki S Ismail
*Assistant Examiner* — Monica Mata
(74) *Attorney, Agent, or Firm* — Greenberg Traurig, LLP

(57) ABSTRACT

A multilayer actuator includes a primary electrode, a secondary electrode overlapping at least a portion of the primary electrode, and an electroactive layer disposed between and abutting the primary electrode and the secondary electrode. The multilayer actuator further includes a primary antireflective coating overlapping at least a portion of the primary electrode opposite the electroactive layer, a secondary antireflective coating overlapping at least a portion of the secondary electrode opposite the electroactive layer, and a barrier layer overlapping the secondary antireflective coating opposite the secondary electrode.

20 Claims, 14 Drawing Sheets

(51) Int. Cl.
*H10N 30/086* (2023.01)
*H10N 30/097* (2023.01)
*H10N 30/87* (2023.01)
*H10N 30/88* (2023.01)
*H10N 30/853* (2023.01)

(56) References Cited

U.S. PATENT DOCUMENTS

2020/0309995 A1* 10/2020 Wells .................. G02B 1/111
2020/0379283 A1* 12/2020 Diguet ................. B60R 16/02

OTHER PUBLICATIONS

Zhao et al., "Spherical aberration free liquid-filled tunable lens with variable thickness membrane", Optics Express, vol. 23, No. 16, Aug. 10, 2015, pp. 21264-21278.
Wei, J, "Wafer Bonding Techniques for Microsystem Packaging", Journal of Physics: Conference Series, vol. 34. No. 1, 2006, pp. 943-948.
Schott, "Bonding the Future", URL: https://www.schott.com/primoceler/hermetic-glass-bonding/, as accessed on Aug. 15, 2019, 9 pages.
Lee et al., "Enhanced optical properties and thermal stability of optically clear adhesives", International Journal of Adhesion and Adhesives, vol. 50, 2014, pp. 93-95.
Lee et al., "Optical properties and adhesion performance of optically clear acrylic pressure sensitive adhesives using chelate metal acetylacetonate", International Journal of Adhesion and Adhesives, vol. 47, 2013, pp. 21-25.
Czech et al., "Photoreactive UV-crosslinkable solvent-free acrylic pressure-sensitive adhesives containing copolymerizable photoinitiators based on benzophenones", European Polymer Journal, vol. 48, No. 8, 2012, pp. 1446-1454.
Baek et al., "Preparation and adhesion performance of transparent acrylic pressure sensitive adhesives: effects of substituent structure of acrylate monomer", International Journal of Adhesion and Adhesives, vol. 64, 2016, pp. 72-77.
Lee et al., "Transparent Conductive Multilayer Films with Optically Clear Adhesive Interlayer for Touch Panel Devices", Journal of Applied Science, vol. 10, No. 12, 2010, pp. 1104-1109.
Jin et al., "Properties of solvent-borne acrylic pressure-sensitive adhesives synthesized by a simple approach", Express Polymer Letters, vol. 3, No. 12, 2009, pp. 814-820.

* cited by examiner

INTEGRATED MULTILAYER ACTUATORS

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
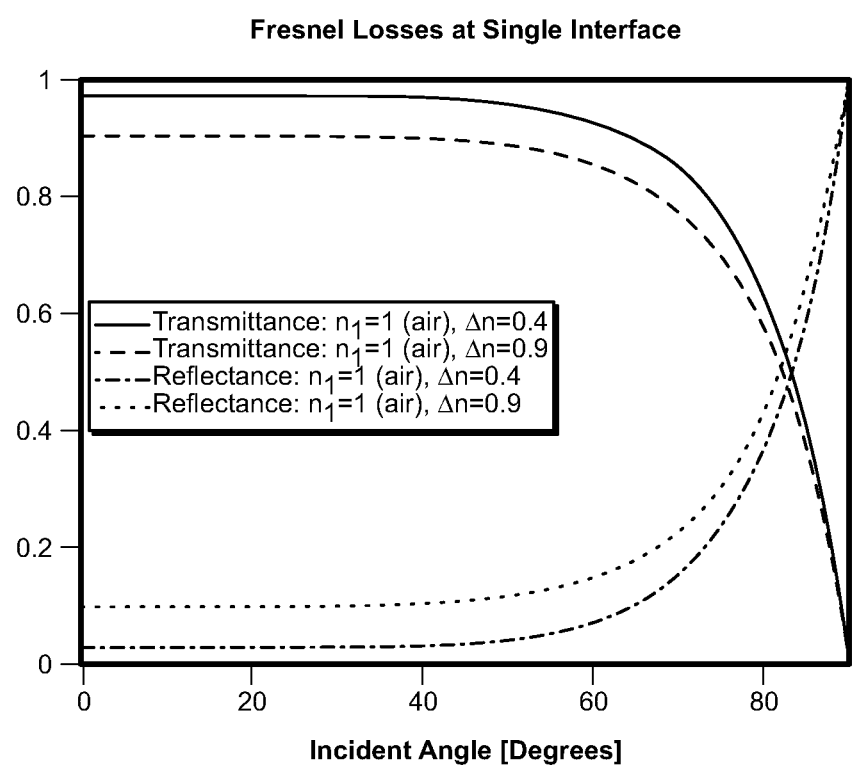
FIG. 1 is a plot of Fresnel reflectivity and transmissivity for a single interface showing "best" and "worst" case scenarios for light incident on example combinations of constituent layers within a multilayer actuator according to some embodiments.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Ceramic and other dielectric materials may be incorporated into a variety of optic and electro-optic device architectures, including active and passive optics and electroactive devices. Electroactive materials, including piezoelectric and electrostrictive ceramics, may change their shape under the influence of an external electric field. Electroactive materials have been investigated for use in various technologies, including actuation, sensing and/or energy harvesting. Lightweight and deformable, electroactive ceramics may be incorporated into wearable devices such as haptic devices and are attractive candidates for emerging technologies including virtual reality/augmented reality devices where a comfortable, adjustable form factor is desired.

Virtual reality and augmented reality eyewear devices or headsets may enable users to experience events, such as interactions with people in a computer-generated simulation of a three-dimensional world or viewing data superimposed on a real-world view. Virtual reality/augmented reality eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of electroactive materials, including the refractive index to manipulate light. Example virtual reality/augmented reality assemblies containing electroactive layers may include deformable or actively tunable optics, such as mirrors, lenses, adaptive optics, active gratings, beam steerers, and selective polarizers. In various aspects, deformation of the electroactive ceramic may be used to actuate optical elements in an optical assembly, such as a lens system.

Although thin layers of many electroactive ceramics can be intrinsically transparent, in connection with their incorporation into an optical assembly or optical device, a variation in refractive index between such materials and adjacent layers, such as conductive electrode layers, may cause light scattering and a corresponding degradation of optical quality or performance. The deterioration of optical properties due to a refractive index mismatch between neighboring layers may be particularly acute in piezoceramic and single crystal-based actuators, where the refractive index for the ceramic layer(s) is typically greater than approximately 2.3 whereas conductive electrodes and commonly-used support materials in such devices are typically characterized by a refractive index of less than approximately 2. In a related vein, electroactive ferroelectric ceramic materials may spontaneously polarize in different directions forming domains and associated birefringent boundaries that scatter light. Further sources of optical scattering in these materials may include porosity and grain boundaries. Thus, notwithstanding recent developments, it would be advantageous to provide ceramic or other dielectric material-containing optical elements having improved actuation characteristics, including a controllable and robust deformation response in an optically transparent package.

As will be described in greater detail below, the instant disclosure relates to actuatable and transparent multilayer optical elements and methods for forming such optical elements. The optical elements may include a layer of an electroactive ceramic material sandwiched between conductive electrodes, and may further include one or more of an antireflective coating, a barrier layer, a bonding layer, and a transparent support. The disclosed optical elements, i.e., multilayer actuators, may be configured to exhibit commercially-relevant electromechanical properties, including deformation response, long-term reliability, and integration compatibility, as well as beneficial optical properties, including antireflection and transparency.

As used herein, "electroactive" materials, including piezoelectric and electrostrictive materials may, in some examples, refer to materials that exhibit a change in size or shape when stimulated by an external electric field. In the presence of an electric field (E-field), an electroactive material may deform (e.g., compress, elongate, bend, etc.) according to the magnitude and direction of the applied field.

In accordance with various embodiments, when exposed to an external electric field, an accumulated displacement of ions within an electroactive ceramic may produce an overall strain (elongation) in the direction of the field. That is, positive ions may be displaced in the direction of the field and negative ions displaced in the opposite direction. In turn, the thickness of the electroactive ceramic may be decreased in one or more orthogonal directions, as characterized by the Poisson's ratio.

Generation of such an electric field may be accomplished, for example, by placing the electroactive material between two electrodes, i.e., a primary electrode and a secondary electrode, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electric field, the electroactive material may be in its relaxed state undergoing no induced deformation, or stated equivalently, no induced strain, either internal or external.

In some instances, the physical origin of the deformation of electroactive materials in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, as well as the dielectric constant and elastic compliance of the electroactive material. Compliance in this case is the change of strain with respect to stress or, analogously, in more practical terms, the change in displacement with respect to force. In some embodiments, an electroactive layer may be pre-strained (or pre-stressed) to modify the stiffness of the optical element and hence its actuation characteristics.

The optical element may be deformable from an initial state to a deformed state when a first voltage is applied between the primary electrode and the secondary electrode and may further be deformable to a second deformed state when a second voltage is applied between the primary electrode and the secondary electrode. In some embodiments, the deformation response may include a mechanical response to the electrical input that varies over the spatial extent of the device, with the electrical input being applied between the primary electrode and the secondary electrode. The mechanical response may be termed an actuation, and example devices or optical elements may be, or include, actuators.

In some embodiments, an optical element may have a maximum thickness in an undeformed state and a compressed thickness in a deformed state. In some embodiments, an optical element may have a minimum thickness in an undeformed state and an expanded thickness in a deformed state. In some embodiments, an optical element may have a density in an undeformed state that is approximately 90% or less of a density of the optical element in the deformed state.

In certain embodiments, an actuator may be located within the transparent aperture of an optical device such as a liquid lens, although the present disclosure is not particularly limited and may be applied in a broader context. By way of example, the optical element may be incorporated into an active grating, tunable lens, accommodative optical element, adaptive optics, etc. According to various embodiments, the optical element may be optically transparent.

As used herein, a material or element that is "transparent" or "optically transparent" may, for example, have a transmissivity within the visible light spectrum of at least approximately 70%, e.g., approximately 70, 80, 90, 95, 97, 98, 99, or 99.5%, including ranges between any of the foregoing values, and less than approximately 10% bulk haze, e.g., approximately 0.5, 1, 2, 4, 6, or 8% bulk haze, including ranges between any of the foregoing values. In accordance with some embodiments, a "fully transparent" material or element may have a transmissivity (i.e., optical transmittance) within the visible light spectrum of at least approximately 90%, e.g., approximately 90, 95, 97, 98, 99, or 99.5%, including ranges between any of the foregoing values, less than approximately 10% bulk haze, e.g., approximately 0.5, 1, 2, 4, 6, or 8% bulk haze, including ranges between any of the foregoing values, less than approximately 30% reflectivity, e.g., approximately 1, 2, 5, 10, 15, 20, or 25% reflectivity, including ranges between any of the foregoing values, and at least 70% optical clarity, e.g., approximately 70, 80, 90, 95, 97, 98, 99, or 99.5% optical clarity, including ranges between any of the foregoing values. Transparent and fully transparent materials will typically exhibit very low optical absorption and minimal optical scattering.

As used herein, the terms "haze" and "clarity" may refer to an optical phenomenon associated with the transmission of light through a material, and may be attributed, for example, to the refraction of light within the material, e.g., due to secondary phases or porosity and/or the reflection of light from one or more surfaces of the material. As will be appreciated by those skilled in the art, haze may be associated with an amount of light that is subject to wide angle scattering (i.e., at an angle greater than 2.5° from normal) and a corresponding loss of transmissive contrast, whereas clarity may relate to an amount of light that is subject to narrow angle scattering (i.e., at an angle less than 2.5° from normal) and an attendant loss of optical sharpness or "see through quality."

According to various embodiments, the electroactive layer may include a transparent ceramic material and the electrodes may each include one or more layers of any suitable conductive material, such as transparent conductive oxides (e.g., TCOs such as ITO), graphene, etc. For instance, the ceramic layer may include a transparent polycrystalline ceramic or a transparent single crystal material. In some embodiments, a polycrystalline electroactive ceramic may have a relative density of at least approximately 99%, e.g., 99%, 99.5%, 99.9%, 99.95%, 99.99%, 99.995%, or 99.999%, including ranges between any of the foregoing values, and an average grain size of at least approximately 300 nm, e.g., 300 nm, 400 nm, 500 nm, 1000 nm, or 2000 nm, including ranges between any of the foregoing values.

Example electroactive ceramics may include one or more ferroelectric ceramics, as well as solid solutions or mixtures thereof. Typically, ferroelectric materials are characterized by high dielectric permittivity values, where the temperature of the maximum real dielectric permittivity corresponds to the ferroelectric-paraelectric phase transition temperature. The so-called relaxor ferroelectrics, on the other hand, may exhibit a more elaborate dielectric response. Relaxor ferroelectrics may be characterized by (i) wide peaks in the temperature dependence of the dielectric permittivity, (ii) a frequency-dependent dielectric permittivity, where the temperature of the respective maxima for the real and imaginary components of the permittivity appear at different values, and (iii) a temperature of the maximum in the real dielectric permittivity that may be independent of the ferroelectric-paraelectric phase transition temperature.

The origin of relaxor behavior in ferroelectrics may be attributed to a positional disorder of cations on A or B sites of the perovskite blocks that delay the evolution of long-range polar ordering. Commonly, the localized disorder in relaxor compounds may be attributed to their complex and disordered chemical structure, where multiple atoms may substitute on one atomic site. In the example of lead magnesium niobium oxide, for instance, both magnesium and niobium can occupy the same position in the crystal lattice. As a further example, lead zirconate titanate (PZT) is a typical ferroelectric perovskite showing a conventional FE-PE phase transition. However, the partial substitution of different elements, such as lanthanum or samarium, may increase disorder within the material and induce relaxor characteristics. Moreover, in accordance with some embodiments, for some lanthanum or samarium concentrations, the distortion of the PZT crystalline lattice due to ion displacement may promote the formation of polar nanoregions (PNRs), which may inhibit the formation of long-range ferroelectric domains. For some compositions, polar nanoregions that are present under zero applied field may beneficially persist through an applied field of at least 2 V/micrometer, e.g., at least 0.5, 1, 1.5, or 2 V/micrometer, including ranges between any of the foregoing values, whereas other compositions having polar nanoregions under zero applied field (e.g., PLZT) may undergo a field-induced relaxor-to-ferroelectric phase transformation, which may adversely impact one or more optical properties.

In accordance with various embodiments, example electroactive ceramics may include one or more compositions from the relaxor-PT-based family, which includes binary compositions such as $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), ternary crystals such as $Pb(Zn_{1/3}Nb_{2/3})O_3$—$PbTiO_3$—$BaTiO_3$ (PZN-PT-BT), and the like. Generally, lead-based relaxor materials may be represented by the formula $Pb(B_1B_2)O_3$, where $B_1$ may include $Mg^{2+}$, $Zn^{2+}$, $Ni^{2+}$, $Sc^{3+}$, $Fe^{3+}$, $Yb^{3+}$, $In^{3+}$, etc. and $B_2$ may include $Nb^{5+}$, $Ta^{5+}$, $W^{6+}$, etc., although other relaxor compositions are contemplated.

Further electroactive ceramic compositions include barium titanate, barium titanium zirconium oxide, barium titanium tin oxide, barium strontium titanium oxide, barium zirconium oxide, lead magnesium titanium oxide, lead magnesium niobium oxide, lead magnesium niobium titanium zirconium oxide, lead scandium niobium oxide, lead scandium tantalum oxide, lead iron niobium oxide, lead iron tantalum oxide, lead iron tungsten oxide, lead indium niobium oxide, lead indium tantalum oxide, lead lanthanum zirconium titanium oxide, lead ytterbium niobium oxide, lead ytterbium tantalum oxide, lead zinc tantalum oxide, lead zinc niobium oxide, lead zinc niobium titanium oxide, lead zinc niobium titanium zirconium oxide, bismuth magnesium niobium oxide, bismuth magnesium tantalum oxide, bismuth zinc niobium oxide, bismuth zinc tantalum oxide, potassium sodium niobate, and combinations thereof.

According to various embodiments, any of the foregoing ceramic compositions may be further combined with one or more of strontium titanium oxide, calcium titanium oxide, lead titanium oxide, lead zirconium titanium oxide, barium titanium oxide, bismuth iron oxide, sodium bismuth titanium oxide, bismuth scandium oxide, bismuth titanium oxide, lithium tantalum oxide, sodium potassium niobium oxide, and lithium niobium oxide. Moreover, the electroactive ceramic compositions may further include one or more dopants such as niobium, potassium, sodium, calcium, gallium, indium, bismuth, aluminum, strontium, barium, samarium, dysprosium, magnesium, iron, tantalum, yttrium, lanthanum, europium, neodymium, scandium and erbium.

Electroactive materials, including polycrystalline ceramics, may be formed by powder processing. Densely-packed networks of high purity, ultrafine polycrystalline particles can be highly transparent and may be more mechanically robust in thin layers than their single crystal counterparts. For instance, optical grade PLZT having >99.9% purity may be formed using sub-micron (e.g., <2 μm) particles. Substitution via doping of $Pb^{2+}$ at A and B-site vacancies with $La^{2+}$ and/or $Ba^{2+}$ may be used to increase the transparency of perovskite ceramics such as textured or un-textured PLZT, PZN-PT and PMN-PT.

As known to those skilled in the art, ultrafine particle precursors can be fabricated via wet chemical methods, such as chemical co-precipitation, sol-gel and gel combustion. Grinding, ball milling, planetary milling, etc. may be used to modify the size and/or shape of ceramic powders. Green bodies may be formed using tape casting, slip casting, or gel casting. High pressure and high temperature sintering via techniques such as conventional sintering, cold sintering, hot pressing, high pressure (HP) and hot isostatic pressure, spark plasma sintering, flash sintering, two-stage sintering, and microwave sintering, for example, may be used to improve the ceramic particle packing density. More than one of the previous techniques may be used in conjunction as understood by one skilled in the art, for example, to achieve initial densification by one process and final densification by a secondary process while controlling grain growth during sintering. Sintered ceramics may be cut to a desired final shape and thinning via lapping and/or polishing may be used to decrease surface roughness to achieve thin, highly optically transparent layers that are suitable for high displacement actuation.

In addition to the foregoing, single crystal ceramics may be formed, for example, using hydrothermal processing or by a Czochralski method to produce an oriented ingot, which may be cut along a specified crystal plane to produce wafers having a desired crystalline orientation. Further methods for forming single crystals include float zone, Bridgman, Stockbarger, chemical vapor deposition, physical vapor transport, solvothermal techniques, etc. A wafer may be thinned, e.g., via lapping or grinding, and/or polished, and transparent electrodes (e.g., a primary electrode and a secondary electrode) may be formed directly on the wafer, using chemical vapor deposition or a physical vapor deposition process such as sputtering or evaporation, for example. According to some embodiments, an electroactive ceramic layer may have an RMS surface roughness of less than approximately 50 nm, e.g., less than 50, 40, 30, 20, 10, or 5 nm, including ranges between any of the foregoing values. The electroactive ceramic may be poled to achieve a desired dipole alignment.

In certain embodiments, the electroactive ceramics disclosed herein may be substantially free of secondary phases, i.e., may contain less than approximately 1% by volume of any secondary phase, including porosity, e.g., less than 1%, less than 0.5%, less than 0.2%, less than 0.1%, less than 0.05%, less than 0.02%, less than 0.01%, less than 0.005%, less than 0.002%, or less than 0.001% by volume, including ranges between any of the foregoing values. In some embodiments, the disclosed electroactive ceramics may be birefringent, which may be attributable to the material having plural distinct domains (e.g., polar nanoregions) or regions of varying polarization having different refractive indices.

According to various embodiments, a relaxor ceramic may include discrete (localized) regions of polar, i.e., non-cubic, material in a matrix having cubic symmetry. According to some embodiments, the polar nanoregions may have at least one dimension (length, width, or depth) of less than approximately 100 nm, e.g., less than 100 nm, less than 50 nm, less than 40 nm, less than 30 nm, less than 20 nm, less than 10 nm, or less than 5 nm, including ranges between any of the foregoing values. Electroactive (relaxor) ceramics may, according to some embodiments, be characterized by cubic or pseudocubic symmetry.

In some embodiments, optical elements may include paired electrodes, which allow the creation of the electrostatic field that forces displacement of the electroactive layer. In some embodiments, an "electrode," as used herein, may refer to an electrically conductive material, which may be in the form of a thin film or a layer. Electrodes may include relatively thin, electrically conductive metals or metal alloys and may be of a non-compliant or compliant nature.

An electrode may include one or more electrically conductive materials, such as a metal, a semiconductor (e.g., a doped semiconductor), carbon nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), conducting polymers (e.g., PEDOT), or other electrically conducting materials. In some embodiments, the electrodes may include a metal such as aluminum, gold, silver, platinum, palladium, nickel, tantalum, tin, copper, indium, gallium, zinc, alloys thereof, and the like. Further example transparent conductive oxides include, without limitation, aluminum-doped zinc oxide, fluorine-doped tin oxide, indium-doped cadmium oxide, indium zinc oxide, indium zinc tin oxide, indium gallium tin oxide, indium gallium zinc oxide, indium gallium zinc tin oxide, strontium vanadate, strontium niobate, strontium molybdate, and calcium molybdate.

Example electrodes may have a sheet resistance of less than approximately 5000 ohms/square. In some embodiments, the electrode or electrode layer may be self-healing, such that damage from local shorting of a circuit can be isolated. Suitable self-healing electrodes may include thin films of materials that deform or oxidize irreversibly upon Joule heating, such as, for example, aluminum.

In some embodiments, a primary electrode may overlap (e.g., overlap in a parallel direction) at least a portion of a secondary electrode. The primary and secondary electrodes may be generally parallel and spaced apart and separated by a layer of electroactive material. A tertiary electrode may overlap at least a portion of either the primary or secondary electrode.

An optical element may include a first electroactive layer, which may be disposed between a first pair of electrodes (e.g., the primary electrode and the secondary electrode). A second optical element, if used, may include a second electroactive layer and may be disposed between a second pair of electrodes. In some embodiments, there may be an electrode that is common to both the first pair of electrodes and the second pair of electrodes.

In some embodiments, one or more electrodes may be optionally electrically interconnected, e.g., through a contact or schoopage layer, to a common electrode. In some embodiments, an optical element may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer.

In some applications, a transparent electroactive actuator used in connection with the principles disclosed herein may include a primary electrode, a secondary electrode, and an electroactive layer disposed between the primary electrode and the secondary electrode. In some embodiments, there may be one or more additional electrodes, and a common electrode may be electrically coupled to one or more of the additional electrodes. For example, a pair of actuators may be disposed in a stacked configuration, with a first common electrode coupled to a first plurality of electrodes, and a second common electrode electrically connected to a second plurality of electrodes. In some embodiments, a common electrode may be electrically coupled (e.g., electrically contacted at an interface having a low contact resistance) to one or more other electrode(s), e.g., a secondary electrode and a tertiary electrode located on either side of a primary electrode.

In some embodiments, electrodes may be flexible and/or resilient and may stretch, for example elastically, when an optical element undergoes deformation. In this regard, electrodes may include a metal such as aluminum, graphene, carbon nanotubes, etc. In other embodiments, relatively rigid electrodes (e.g., electrodes including one or more transparent conducting oxides (TCOs) such as indium tin oxide (ITO) or indium gallium zinc oxide (IGZO)) may be used.

In some embodiments, the electrodes (e.g., the primary electrode and the secondary electrode) may have a thickness of approximately 0.35 nm to approximately 1000 nm, e.g., approximately 0.35, 0.5, 1, 2, 5, 10, 20, 50, 100, 200, 500, or 1000 nm, including ranges between any of the foregoing values, with an example thickness of approximately 10 nm to approximately 50 nm. In some embodiments, a common electrode may have a sloped shape, or may be a more complex shape (e.g., patterned or freeform). In some embodiments, a common electrode may be shaped to allow compression and expansion of an optical element or device during operation.

The electrodes in certain embodiments may have an optical transmissivity of at least approximately 50%, e.g., approximately 50%, approximately 60%, approximately 70%, approximately 80%, approximately 90%, approximately 95%, approximately 97%, approximately 98%, approximately 99%, or approximately 99.5%, including ranges between any of the foregoing values.

In some embodiments, the electrodes described herein (e.g., the primary electrode, the secondary electrode, or any other electrode including any common electrode) may be fabricated using any suitable process. For example, the electrodes may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like. In further aspects, the electrodes may be manufactured using a thermal evaporator, a sputtering system, stamping, and the like.

In some embodiments, a layer of electroactive material may be deposited directly on to an electrode. In some embodiments, an electrode may be deposited directly on to the electroactive material. In some embodiments, electrodes may be prefabricated and attached to an electroactive material. For instance, a prefabricated electrode may be bonded to an electroactive layer by thermocompression or metallic bonding, or by using an adhesive layer such as a pressure sensitive adhesive. Example pressure sensitive adhesives include various acrylate compounds. In further embodiments, an electrode may be deposited on a substrate, for example a glass substrate or flexible polymer film. In some embodiments, the electroactive material layer may directly abut an electrode. In some embodiments, there may be an insulating layer, such as a dielectric layer, between a layer of electroactive material and an electrode.

The electrodes may be used to affect large scale deformation, i.e., via full-area coverage, or the electrodes may be patterned to provide spatially localized stress/strain profiles. In particular embodiments, a deformable optical element and an electroactive layer may be co-integrated whereby the deformable optical element may itself be actuatable. In addition, various methods of forming optical elements are disclosed, including solution-based and solid-state deposition techniques.

In some embodiments, the application of an electric field over an entirety of an electroactive layer may generate substantially uniform deformation between the primary and secondary electrodes. In some embodiments, the primary electrode and/or the secondary electrode may be patterned, allowing a localized electric field to be applied to a portion of the optical element, for example, to provide a localized deformation. According to some embodiments, patterned electrodes (e.g., one or both of a primary electrode and a secondary electrode) may be used to actuate one or more regions within an intervening electroactive layer, i.e., to the exclusion of adjacent regions within the same electroactive layer.

In some embodiments, such patterned electrodes may be independently actuatable. Patterned electrodes may be formed by selective deposition of an electrode layer or by blanket deposition of an electrode layer followed by patterning and etching, e.g., using photolithographic techniques, as known to those skilled in the art. For instance, a patterned electrode may include a wire grid, or a wire grid may be incorporated into an optical element as a separate layer adjacent to an electrode layer. Discretely patterned electrodes may be individually addressable with distinct voltages, either simultaneously or sequentially.

For electroactive materials, particularly single crystal and polycrystalline piezoelectrics, optical absorption is characteristically low and transmissive losses are typically dominated by reflectivity. Moreover, piezoceramics and single crystal electroactive compositions typically have high refractive indices, which can substantially mismatch neighboring media resulting in surface reflections. Summarized in Table 1 are example materials that may be used for the electroactive layer, electrodes, passive support, as well as application specific layers.

TABLE 1

Example Multilayer Actuator Materials

| | Material | Refractive Index |
|---|---|---|
| Electroactive Layer | PMN-PT | 2.4-2.6 |
| | PZT | 2.4 |
| Electrode | ITO | ~1.9 |
| Passive Support | Plastic | 1.4-1.6 |
| | Glass | 1.4-1.9 |
| | Sapphire | 1.7-1.8 |
| Liquid Lens Fluid | Polyphenyl ether (PPE) | 1.58 |
| | Phenylated siloxane oil | 1.62 |

Referring to FIG. 1, plotted are reflectance and transmittance as a function of incident angle across a single interface for example combinations of layers using materials from Table 1. As shown in FIG. 1, Fresnel losses from reflections can be as high as 10%. In view of the foregoing, in order to mediate reflective losses and inhibit the creation of optical artifacts such as ghost images, example multilayer structures may further include an antireflective coating (ARC).

According to various embodiments, an antireflective coating may be disposed over either or both electrodes (e.g., a primary antireflective coating may be formed over at least a portion of a surface of the primary electrode opposite to the electroactive layer and/or a secondary antireflective coating may be formed over at least a portion of a surface of the secondary electrode opposite to the electroactive layer).

The antireflective coating(s) may be optically transparent and accordingly exhibit less than 10% bulk haze and a transmissivity within the visible spectrum of at least 50%. For instance, an antireflective coating may be configured to maintain at least 70% transmissivity over $10^6$ actuation cycles and an induced engineering strain of up to approximately 1%. In some embodiments, the antireflective coating(s) may exhibit a reflectivity within the visible spectrum of less than approximately 30%.

Example antireflective coatings may include one or more dielectric layers, which may include a stoichiometric or non-stoichiometric oxide, fluoride, oxyfluoride, nitride, oxynitride, sulfide, including but not limited to $SiO_2$, $TiO_2$, $Al_2O_3$, $Y_2O_3$, $HfO_2$, $ZrO_2$, $Ta_2O_5$, $Cr_2O_3$, $AlF_3$, $MgF_2$, $NdF_3$, $LaF_3$, $YF_3$, $CeF_3$, $YbF_3$, $Si_3N_4$, $ZnS$, or $ZnSe$.

In some embodiments, an antireflective coating may be configured as a multilayer stack. A multilayer stack may include one or more dielectric layers, and in certain embodiments an antireflective coating may include a transparent electrode. That is, a primary electrode or a secondary electrode may be integrated into a multilayer antireflective coating.

In some embodiments, the anti-reflective coating may include combinations of one or more of the aforementioned oxides and/or one or more of the aforementioned fluorides. Example anti-reflective coatings may include: (a) one of the above-identified oxides, (b) one of the above-identified fluorides, (c) two of the above-identified oxides, (d) one of the above-identified oxides combined with one of the above-identified fluorides, (e) two of the above-identified oxides combined with one of the above-identified fluorides, (f) two of the above-identified oxides combined with two of the above-identified fluorides, or (g) three of the above-identified oxides. By way of example, a multilayer stack may include a layer of zinc oxide disposed directly over an electrode and a layer of silicon dioxide disposed over the layer of zinc oxide, although further combinations are contemplated.

In accordance with some embodiments, an antireflective coating may operate to gradually decrease the refractive index between that of the electroactive layer and an adjacent, typically lower index material. In various embodiments, an antireflective coating may include multiple layers of varying refractive index and/or one or more layers having a refractive index gradient.

An ARC layer may have any suitable thickness, including, for example, a thickness of approximately 10 nm to approximately 1000 nm, e.g., approximately 10, 20, 50, 100, 200, 500, or 1000 nm, including ranges between any of the foregoing values, with an example thickness range of approximately 50 nm to approximately 100 nm.

In various embodiments, the one or more layers within an antireflective coating may be fabricated using any suitable process. For example, the ARC layer(s) may be fabricated using physical vapor deposition (PVD), chemical vapor deposition (CVD), atomic layer deposition (ALD), evaporation, spray-coating, spin-coating, dip-coating, screen printing, Gravure printing, inkjet printing, aerosol jet printing, doctor blading, and the like.

In some embodiments, a multilayer actuator stack may include a barrier layer. A suitable barrier layer may operate as a functional coating adapted to decrease the transmittance therethrough of light and/or the transpiration therethrough of water, water vapor, or other liquids or gases. In certain embodiments, a barrier layer may be configured inhibit the permeation of water vapor to less than approximately $10^{-6}$ g/m$^2$/day and/or inhibit the permeation of oxygen to less than approximately $10^{-5}$ cm$^3$/m$^2$/day. According to further embodiments, a barrier layer may improve the mechanical robustness of a multilayer actuator, e.g., via crack blunting and/or vibration reduction. A barrier layer may be colorless, chemically inert, electrically insulating, and/or scratch resistant and may include various epoxy compounds. In some embodiments, an antireflective coating, e.g., one or more layers within a multilayer antireflective coating, may serve as a barrier layer.

A bonding layer, such as an optical adhesive, may be used to join adjacent layers within a multilayer structure. According to some embodiments, a bonding layer may include a pressure-sensitive adhesive (PSA) such as one or more acrylate-based polymers derived from soft monomers (i.e., low $T_g$ monomers for tack and flexibility), hard monomers (i.e., high $T_g$ monomers for cohesion strength) and functional monomers (e.g., for adhesion strength). Example PSA materials include 2-ethylhexyl acrylate (2-EHA), methyl methacrylate (MMA), butylacrylate, hexylacrylate, isooctylacrylate, 2-hydroxyethyl acrylate (2-HEA), lauryl acrylate (LA), acrylic acid (AA), 2-phenoxy ethyl acrylate (2-PEA), etc. In some embodiments, such acrylates may be functionalized with a cross linking agent, such as aluminum acetylacetonate (AlAcAc), zirconium acetylacetonate (ZrAcAc), hafnium carboxyethyl acrylate (HCA), and the like.

In some embodiments, the barrier layer and/or the bonding layer may include a double network tough adhesive (DNTA). A DNTA, which may be colorless and optically clear, may include a high-performance PSA with acid and epoxy functionalities combined with an acrylated urethane oligomer, a methacrylated silane thermoset cross-linker, and/or a photo-initiator (e.g., a metal chelate ionic cross-linker).

In accordance with certain embodiments, an optical element such as a multilayer actuator may include a passive support, which may include a glass, ceramic, polymer or other dielectric composition. An example passive support may include sapphire. A passive support may influence the mechanical performance of the actuator including its stiffness and buckling response. In some embodiments, the support may include a planar, meniscus, or ophthalmic glass substrate. In some embodiments, a bonding layer may be used to affix the passive support to the actuator architecture.

In accordance with certain embodiments, a transparent actuator including an electroactive layer disposed between transparent electrodes may be incorporated into a variety of device architectures where capacitive actuation and the attendant strain realized in the electroactive layer (e.g., lateral expansion and compression in the direction of the applied electric field) may induce deformation in one or more adjacent active layers within the device and accordingly change the optical performance of the active layer(s). Lateral deformation may be essentially 1-dimensional, in the case of an anchored thin film, or 2-dimensional.

Insomuch as many piezoelectric ceramics and single crystals are limited to less than approximately 0.1% to approximately 2% strain before failure, electroactive actuators are commonly operated in a bending mode to achieve large displacements albeit with a compromise in force output. In an example bimorph bending mode actuator, alternating tensile and compressive stresses above and below a neutral plane may be used to generate bending motion. As such, multilayer structures with one or more electroactive layers may be used to achieve a desired stress (and strain) condition. A bending actuator architecture having a bimorph configuration is shown schematically in FIG. 2.

According to further embodiments, a drive scheme architecture may be dependent on poling conditions as well as the overall device structure, e.g., bimorph or unimorph. For instance, a parallel (or biased unipolar) electrical drive scheme is illustrated schematically in FIG. 2, where the arrows indicate the associated poling directions within the electroactive layers 211, 212. For parallel drive, a positive max voltage (+) may be applied to the supply. For a biased unipolar drive, bias voltage (b) may be applied to the supply with a positive max voltage applied at the amplifier input.

In certain applications, such as a liquid lens, where a high net displacement over a large surface area may be beneficial, the onset of buckling instabilities may decrease the accessible actuation range for some multilayer actuator geometries. Buckling may occur when a structure is loaded above a critical compressive stress, which for a transparent actuator is related to the stress induced via the indirect piezoelectric effect. According to some embodiments, however, the usable actuation range otherwise limited by a buckling instability may be improved through appropriate mechanical design, e.g., to increase the critical compressive stress of the electroactive layer(s).

As will be appreciated, the critical compressive stress is proportionate to the overall stiffness of a multilayer structure and can be increased through appropriate selection of both active and inactive material layers therein. In this regard, a unimorph design can beneficially mitigate buckling because the elastic moduli and layer thicknesses in such a structure are decoupled from actuation, in contrast to a bimorph structure where both layers typically include an electroactive material with matching thicknesses.

Figure 2:
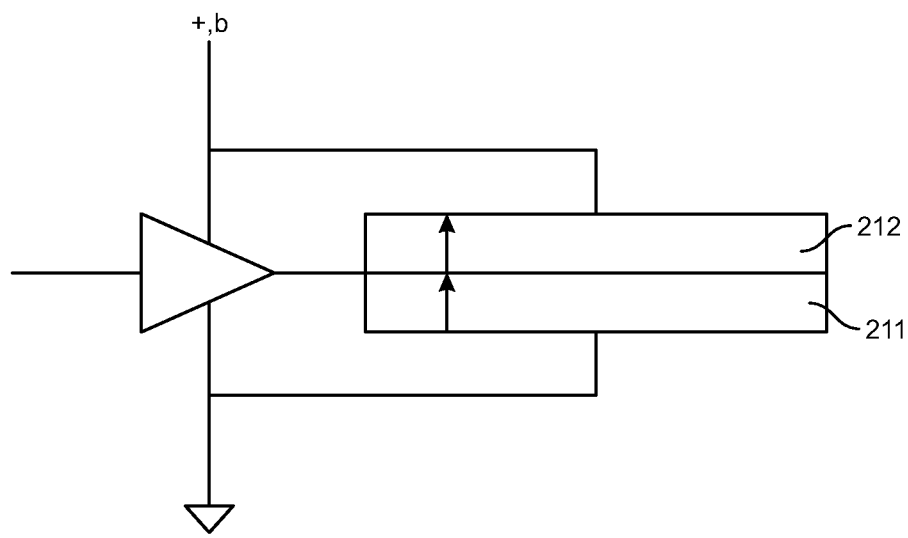
FIG. 2 is a schematic diagram illustrating a parallel or biased unipolar drive scheme for a piezoelectric bimorph actuator according to some embodiments.
Figure 3:
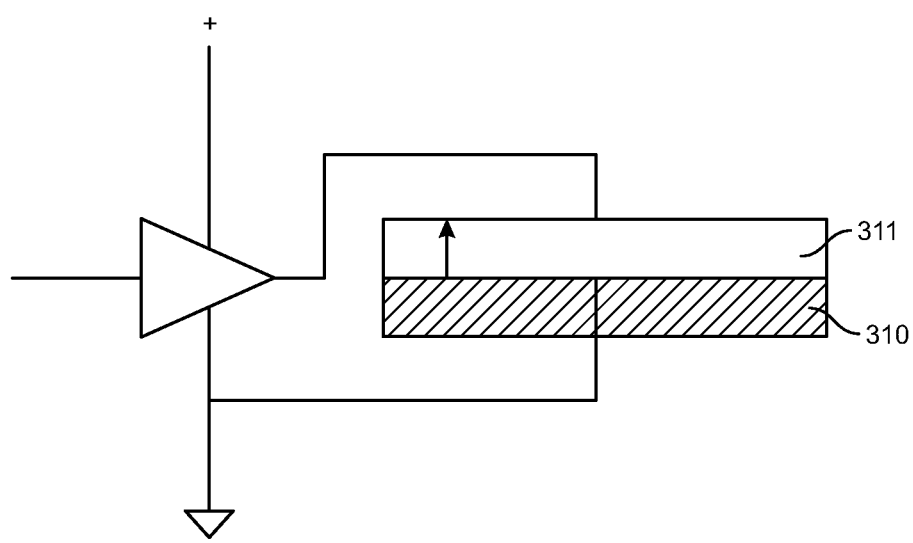
FIG. 3 is a schematic diagram illustrating a unipolar drive scheme for an example piezoelectric unimorph actuator according to certain embodiments.

In FIG. 3, shown is a unipolar drive scheme for a unimorph actuator where the electroactive layer 311 is disposed over a transparent support 310, such as a glass substrate. For a unipolar drive, a positive max voltage (+) may be applied to the supply. In FIGS. 2 and 3, the individual electrode, antireflective, barrier, and bonding layers are omitted for clarity.

As used herein, a "bimorph" or a "bimorph actuator" may, in some examples, refer to a cantilevered structure having two electroactive layers, e.g., electroactive layers 211, 212 in FIG. 2. In some embodiments, the engineered deformation of two electroactive layers that are alternatively placed in expansion and compression by oppositely applied voltages may be used to induce bending or curvature changes in a device stack, which may be used to provide optical tuning such as focus or aberration control. In contrast to a bimorph actuator, a "unimorph" or a "unimorph actuator" may, in some examples, include only a single electroactive layer, e.g., electroactive layer 311 in FIG. 3, paired with an adjacent inactive layer or support, e.g., transparent support 310 in FIG. 3, to generate bending.

Figure 4:
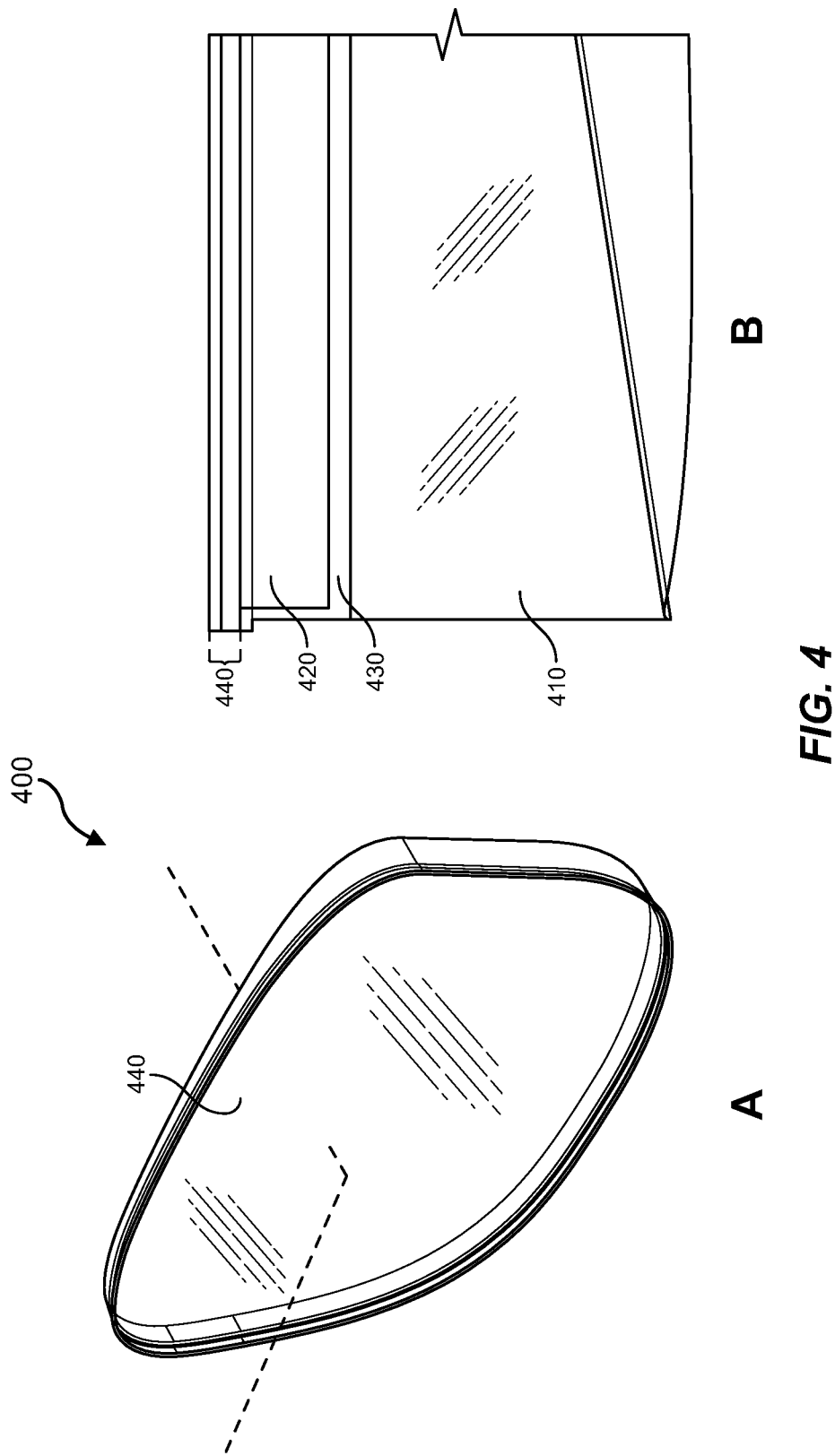
FIG. 4 shows a cross-sectional view and a corresponding perspective view of a transparent and deformable multilayer actuator incorporated into a liquid lens according to various embodiments.

In some embodiments, an optical device may include a liquid lens. As will be appreciated, in accordance with various embodiments, a liquid lens fitted with a multilayer actuator may provide varifocal accommodation with high see-through quality and effective actuation within a commercially-relevant form factor. That is, a liquid lens having a transparent multilayer actuator functioning as a deformable surface is an attractive solution to meet space constraints. FIG. 4A shows an example liquid lens architecture. Liquid lens 400 may be configured for one or more artificial reality applications, for example. FIG. 4B illustrates an example lens architecture, according to various embodiments. Example liquid lens 400 may include a passive support 410 with a lens liquid 420 disposed over the passive support 410 and contained by edge seal 430 and an overlying multilayer actuator 440.

According to various embodiments, a multilayer actuator may include a primary electrode, a secondary electrode overlapping at least a portion of the primary electrode, an electroactive layer disposed between and abutting the primary electrode and the secondary electrode, a primary antireflective coating overlapping at least a portion of the primary electrode opposite the electroactive layer, a secondary antireflective coating overlapping at least a portion of the secondary electrode opposite the electroactive layer, and a barrier layer overlapping the secondary antireflective coating opposite the secondary electrode.

The application of a voltage between the electrodes can cause compression or expansion of the intervening electroactive layer in the direction of the applied electric field and an associated expansion or contraction of the electroactive layer in one or more transverse dimensions. In some embodiments, an applied voltage (e.g., to the primary electrode and/or the secondary electrode) may create at least approximately 0.02% strain in the electroactive layer (e.g., an amount of deformation in the direction of the applied force resulting from the applied voltage divided by the initial dimension of the material) in at least one direction (e.g., an x, y, or z direction with respect to a defined coordinate system).

An electrical signal may include a potential difference, which may include a direct or alternating voltage. In some embodiments, the frequency may be higher than the highest mechanical response frequency of the device, so that deformation may occur in response to the applied RMS electric field but with no appreciable oscillatory mechanical response to the applied frequency. The applied electrical signal may generate non-uniform constriction of the electroactive layer between the primary and secondary electrodes. A non-uniform electroactive response may include a curvature of a surface of the optical element, which may in some embodiments be a compound curvature.

In some embodiments, an optical device may include additional elements interleaved between electrodes, such as in a stacked configuration. For example, electrodes may form an interdigitated stack of electrodes, with alternate electrodes connected to a first common electrode and the remaining alternate electrodes connected to a second common electrode. An additional optical element may be disposed on the other side of a primary electrode. The additional optical element may overlap a first optical element. An additional electrode may be disposed abutting a surface of any additional optical element.

Features from any of the embodiments described herein may be used in combination with one another in accordance with the general principles described herein. These and other embodiments, features, and advantages will be more fully understood upon reading the following detailed description in conjunction with the accompanying drawings and claims.

The instant disclosure will provide, with reference to FIGS. 1-18, detailed descriptions of multilayer actuators and the integration of such multilayer actuators into various optical systems. The discussion associated with FIG. 1 includes a description of optical transmission and reflective losses associated with example layer interfaces within a multilayer architecture. The discussion associated with FIGS. 2 and 3 relates to bimorph and unimorph architectures and various driver circuits that may be used to actuate transparent multilayer actuators. The discussion associated with FIG. 4 includes a description of a multilayer actuator incorporated into a liquid lens. The discussion associated with FIGS. 5 and 6 includes a description of example multilayer bimorph actuators. The discussion associated with FIGS. 7 and 8 includes a description of the displacement range as a function of applied field for various actuator architectures. The discussion associated with FIGS. 9-11 includes a description of example multilayer unimorph actuators. The discussion associated with FIGS. 12 and 13 includes a description of example methods of manufacturing multilayer bimorph and unimorph actuators. The discussion associated with FIGS. 14-18 relates to exemplary virtual reality and augmented reality device architectures that may include a multilayer actuator having a transparent electroactive ceramic layer.

Figure 6:
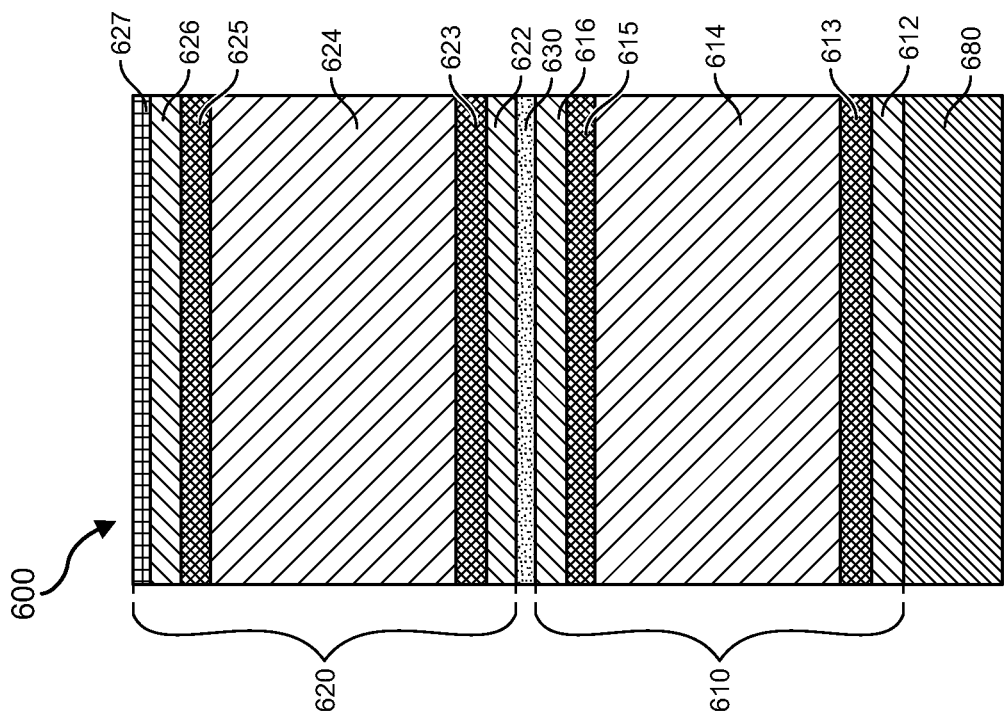
FIG. 6 is a schematic cross-sectional illustration of a bimorph actuator configured for a liquid lens design according to some embodiments.
Figure 5:
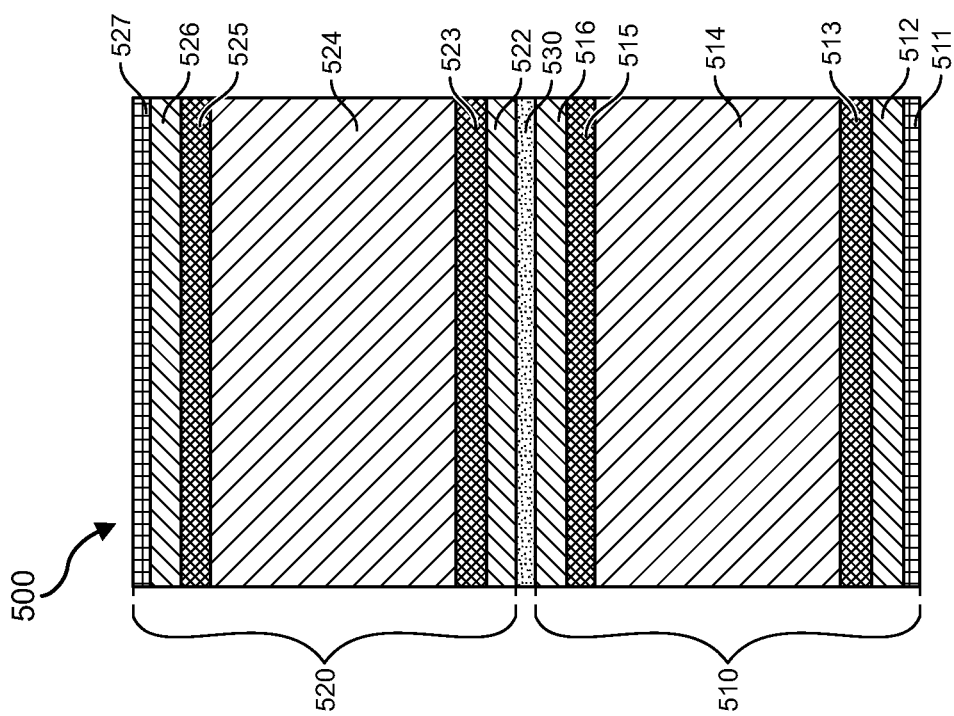
FIG. 5 is a schematic cross-sectional illustration of an example bimorph actuator according to some embodiments.

Example functional multilayer stacks, in accordance with various embodiments of the present disclosure, are shown in the cross-sectional schematic views of FIGS. 5 and 6. Referring to FIG. 5, an example multilayer bimorph actuator 500 may include a first optical element 510 bonded via bonding layer 530 to an overlying second optical element 520. First optical element 510 may include, from bottom to top, a first barrier layer 511, a first primary antireflective coating 512, a first primary electrode 513, a first electroactive layer 514, a first secondary electrode 515, and a first secondary antireflective coating 516. Second optical element 520 may include, from bottom to top, a second primary antireflective coating 522, a second primary electrode 523, a second electroactive layer 524, a second secondary electrode 525, a second secondary antireflective coating 526, and a second barrier layer 527.

Bonding layer 530 may include any suitable optical adhesive. In some embodiments, the refractive index of the bonding layer 530 may be tuned to one or more adjacent layers, e.g., first secondary antireflective coating 516 and/or second primary antireflective coating 522, to decrease reflective losses between first optical element 510 and second optical element 520. Moreover, according to some embodiments, bonding layer 530 may enable independent manufacture of the first optical element 510 and the second optical element 520. Such independent manufacture may avoid co-firing of electroactive and electrode layers and thereby preserve high quality, low roughness interfaces for high transmissivity.

According to further embodiments, a liquid lens-specific bimorph architecture is shown in FIG. 6, where multilayer bimorph actuator 600 may include a first optical element 610 adjacent to and bonded via a bonding layer 630 to an overlying second optical element 620. First optical element 610 may include, from bottom to top, a first primary antireflective coating 612, a first primary electrode 613, a first electroactive layer 614, a first secondary electrode 615, and a first secondary antireflective coating 616. Second optical element 620 may include, from bottom to top, a second primary antireflective coating 622, a second primary electrode 623, a second electroactive layer 624, a second secondary electrode 625, a second secondary antireflective coating 626, and a barrier layer 627.

In the architecture illustrated in FIG. 6, an antireflective coating (e.g., the first primary antireflective coating 612) may be configured as a diffusion barrier located between lens fluid 680 and the remaining portions of the stack, thus obviating the need for a dedicated barrier layer.

Figure 7:
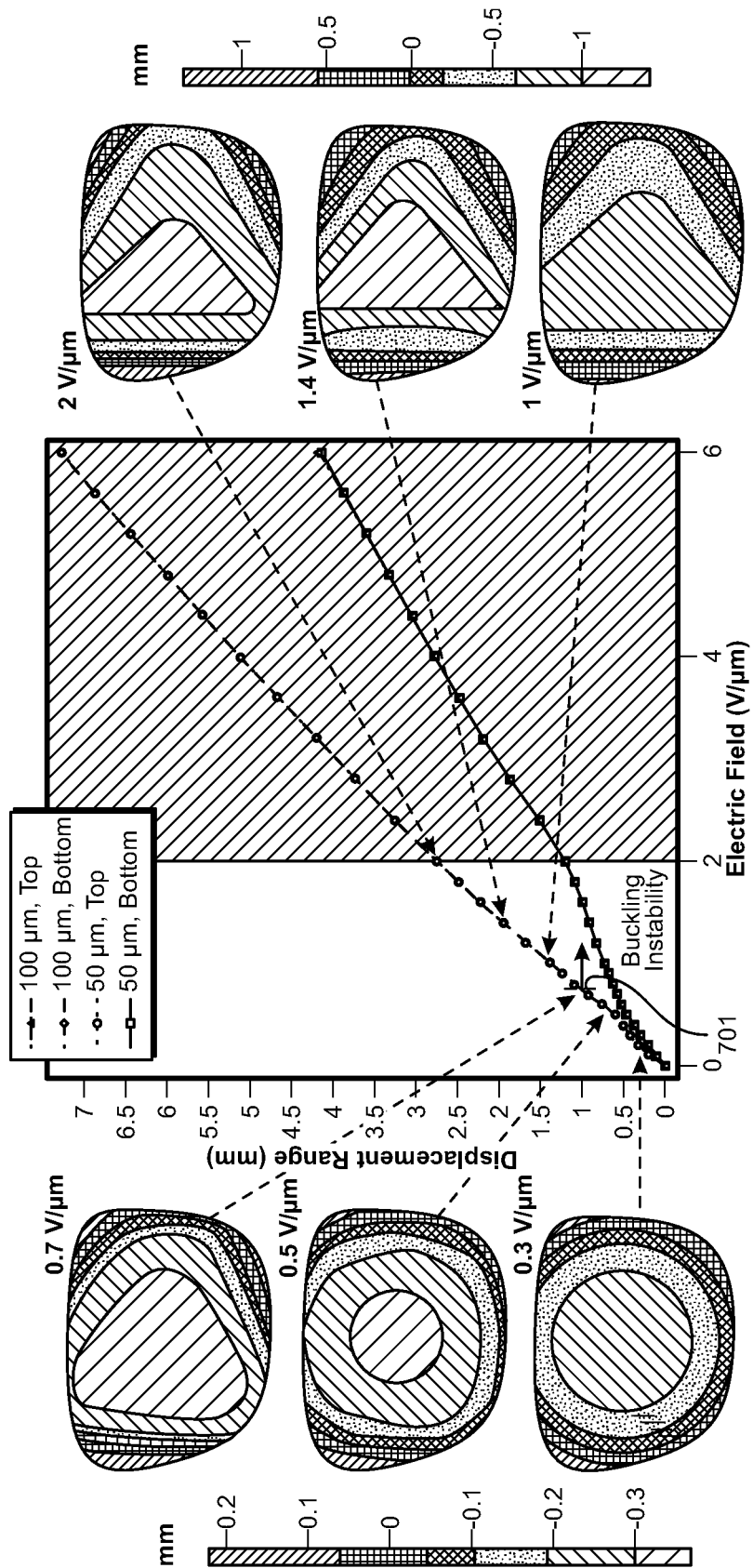
FIG. 7 shows a plot of displacement as a function of applied electric field for example PMN-PT-based bimorph actuators and associated deformation profiles according to certain embodiments.
Figure 8:
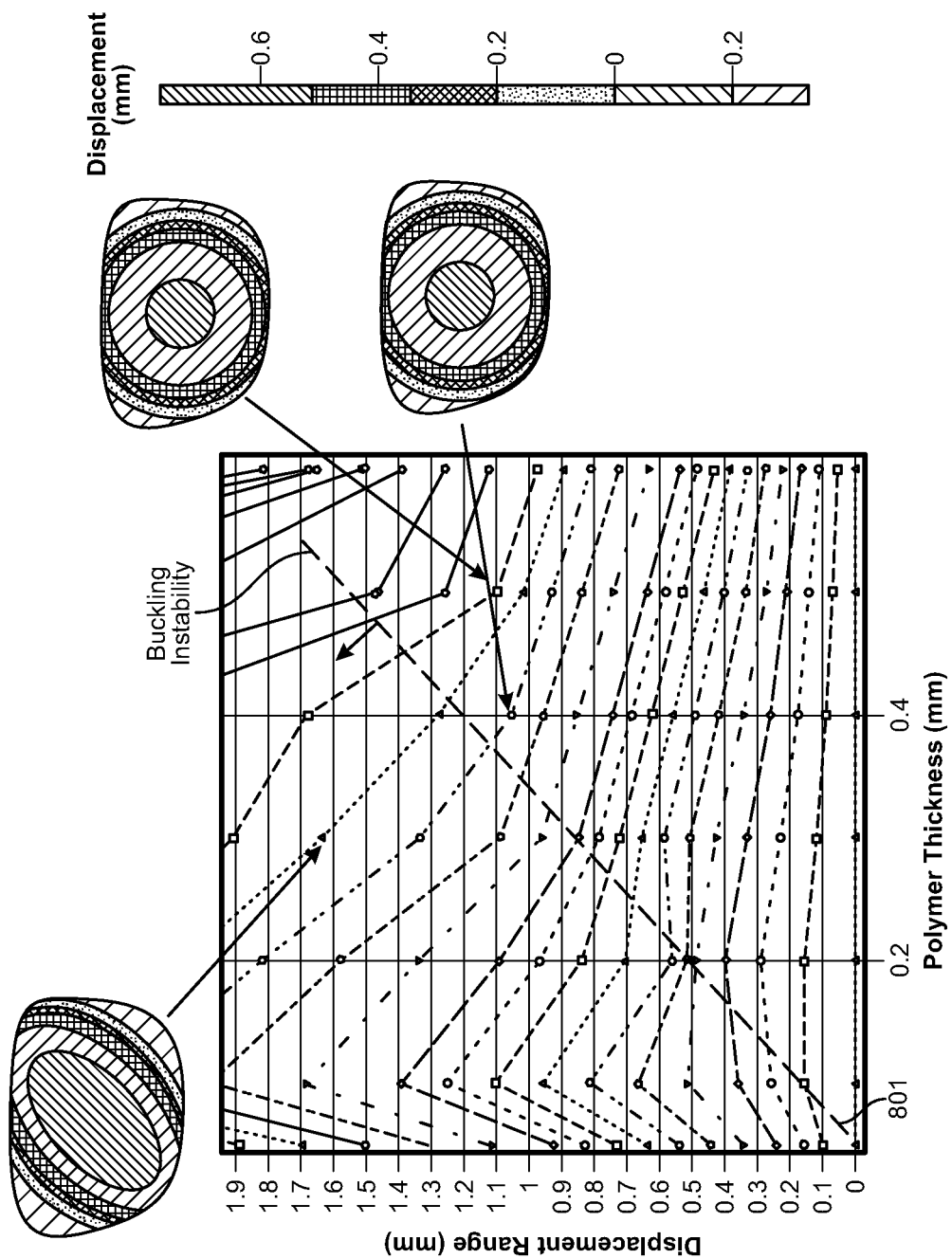
FIG. 8 is a plot of displacement as a function of support thickness for a PMN-PT-based unimorph actuator according to certain embodiments.

The actuation ranges for simulated bimorph actuators and a simulated unimorph actuator are depicted in FIG. 7 and FIG. 8, respectively. Referring to FIG. 7, the modeled data show displacement as a function of applied field for symmetric PMN-PT bimorphs (50 μm/50 μm and 100 μm/100 μm). Dashed line 701 denotes the onset of buckling instability for the 50 μm/50 μm bimorph design. Surface deformation profiles show increasingly asymmetric deformation at voltages near the onset of instability.

Modeled displacement data as a function of applied field for a 50 μm thick PMN-PT unimorph actuator having a 3 GPa polymer support with varying thickness are shown in FIG. 8. With reference also to FIG. 7, the data reveal that the unimorph can achieve slightly larger displacements and a more ideal (axisymmetric and spherical) deformation profile at voltages near the onset of the buckling instability, which is shown as dashed line 801.

The simulations in FIGS. 7 and 8 consider idealized structures of an electroactive material layer and support, which can generally be considered reasonable approximations of the response of full multilayer structures when the thicknesses of additional layers are much less than the combined thickness of the electroactive material and support.

Figure 10:
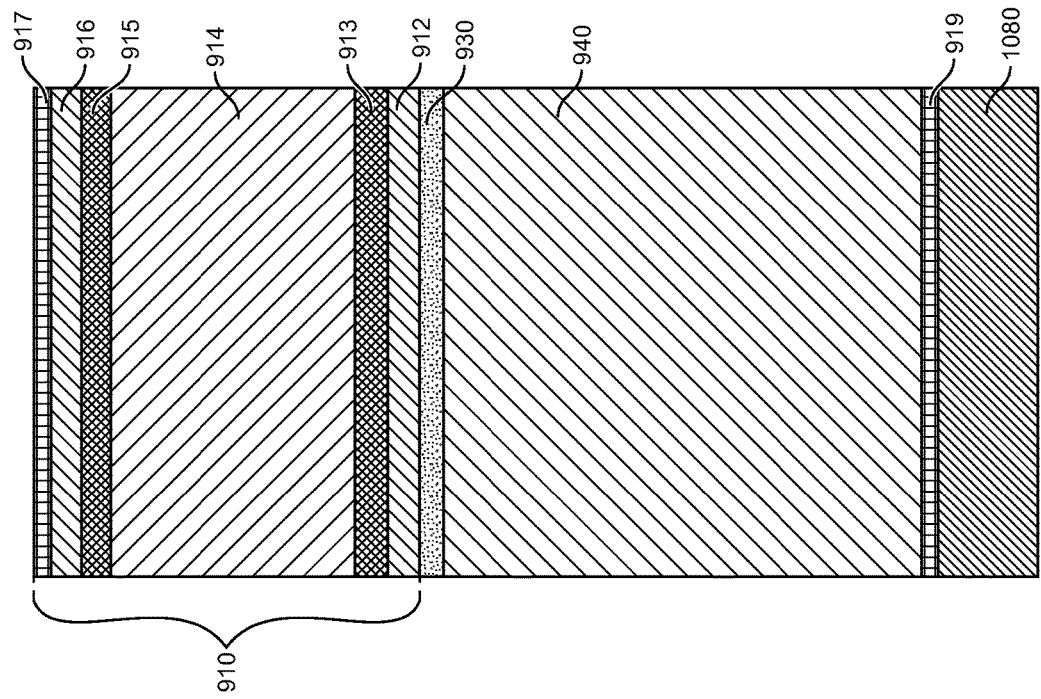
FIG. 10 is a schematic cross-sectional illustration of a unimorph actuator configured for a liquid lens design according to some embodiments.
Figure 9:
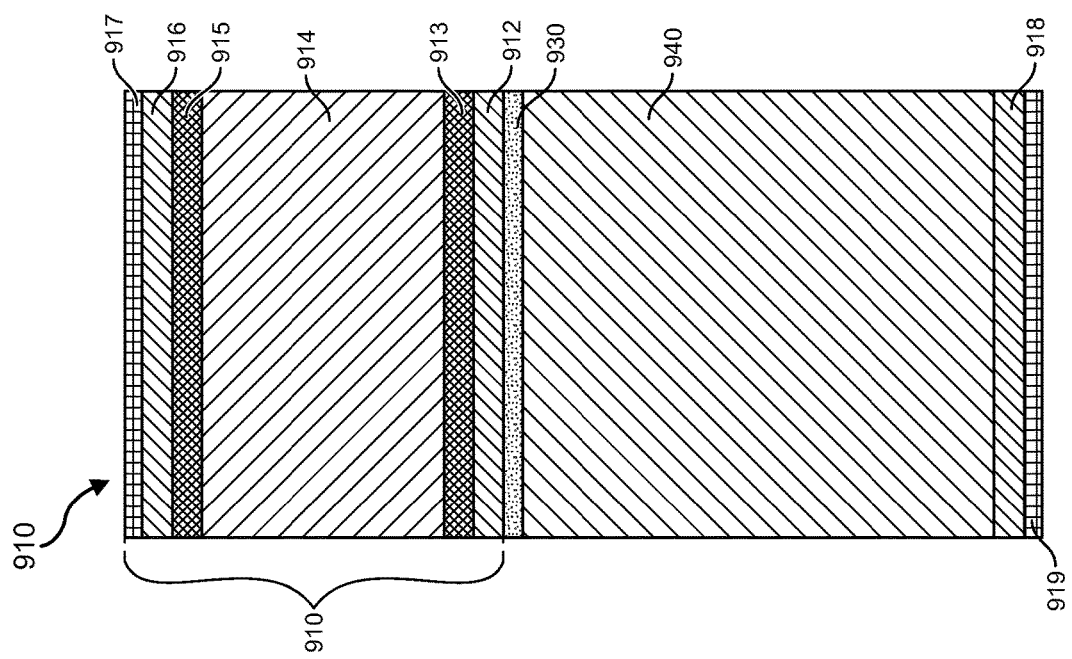
FIG. 9 is a schematic cross-sectional illustration of an example unimorph actuator according to some embodiments.
Figure 11:
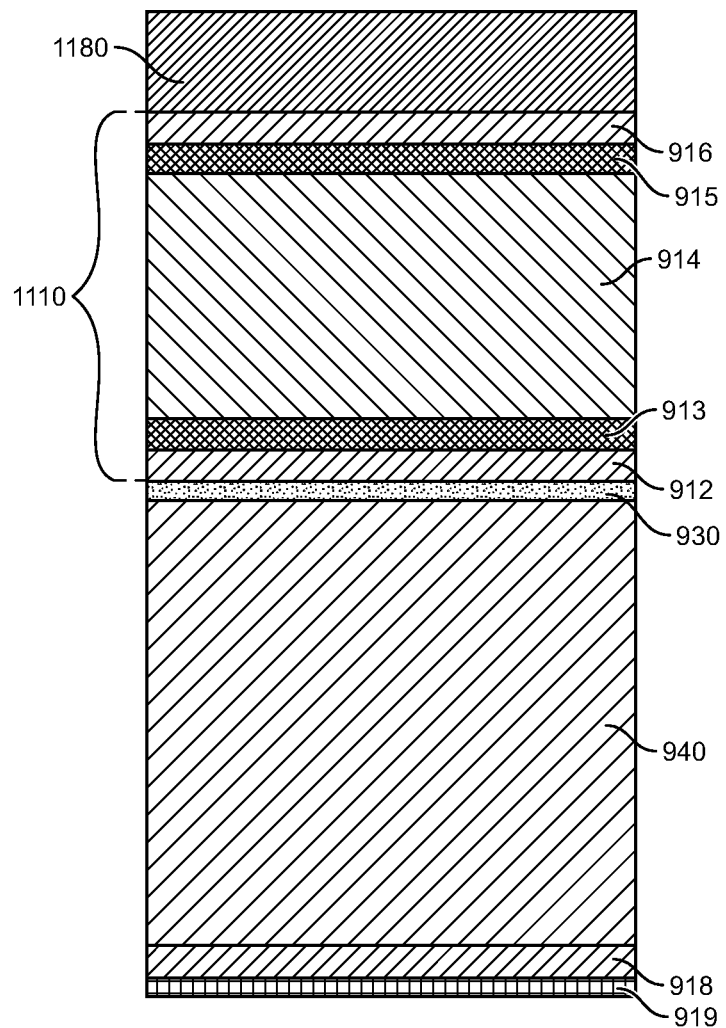
FIG. 11 is a schematic cross-sectional illustration of a unimorph actuator configured for a liquid lens design according to further embodiments.

Turning to FIGS. 9-11, shown are schematic cross-sectional views of example unimorph multilayer actuators. Referring to FIG. 9, the stacked structure of an example unimorph multilayer actuator 900 includes an optical element 910 overlying and bonded via bonding layer 930 to a passive support 940. Optical element 910 includes, from bottom to top, a primary antireflective coating 912, a primary electrode 913, an electroactive layer 914, a secondary electrode 915, a secondary antireflective coating 916, and a barrier layer 917.

A casting or molding process around the optical element 910 may be used to directly integrate a polymer support 940 into the overall stack. A casting or molding process may be additionally advantageous as a manufacturable approach to produce a variable thickness polymer support 940, where the total thickness can be used to improve the surface deformation profile and remove higher order aberrations. In lieu of a polymer support, the passive support 940 may alternately include an optical ceramic or glass composition. Depending on the refractive index and durability of the support 940, an optional antireflective coating 918 and barrier layer 919 may also be included.

Referring to FIG. 10, in certain embodiments, the passive support material may be selected to index match the lens fluid of a liquid lens. In such embodiments, an additional antireflective coating (e.g., antireflective coating 918 in FIG. 9) between the passive support 940 and the lens fluid 1080 may not be needed. Based on their high transmissivity and low haze, polymers such as polycarbonate (PC), poly(methyl methacrylate) (PMMA), and polyethylene terephthalate (PET) may be used as the passive support material. Moreover, PC and PET also have refractive indices closely matched to PPE-based lens fluids typically used in liquid lenses.

Referring to FIG. 11, shown is a further liquid lens specific architecture for a transparent optical unimorph actuator where the lens fluid 1180 is immediately adjacent to optical element 1110, i.e., in contact with secondary antireflective coating 916. As in the embodiment of FIG. 10, a barrier layer between the optical element 1110 and the lens fluid 1180 may be included or omitted (as shown).

As will be appreciated with reference to the stack architectures of FIGS. 5, 6 and 9-11, different barrier layers and antireflective coatings may be used based on whether the lens fluid is adjacent to the electroactive layer or the support. In certain embodiments, the multilayer optical actuator architecture may be designed to inhibit lens fluid-polymer compatibility challenges that may affect device performance and lifetime.

Figure 12:
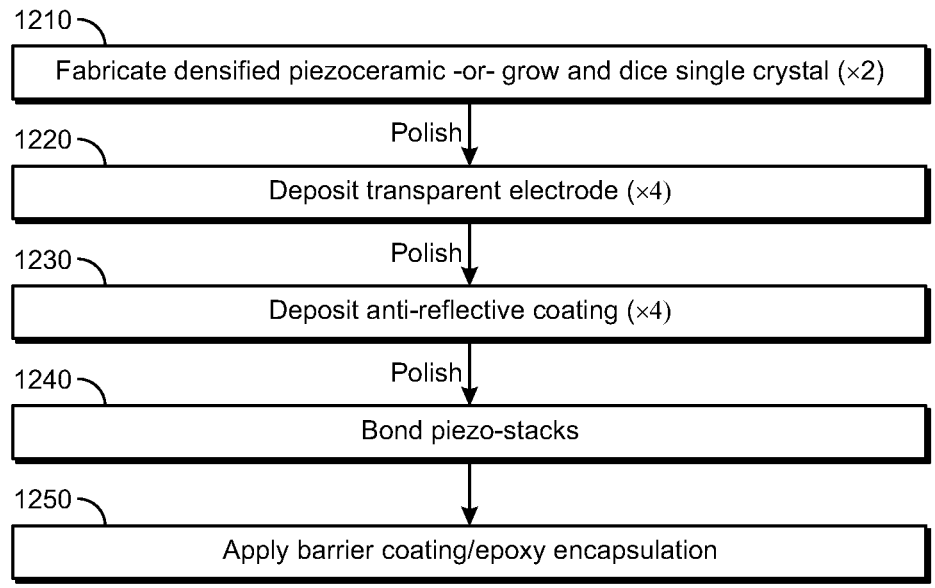
FIG. 12 illustrates an example method for fabricating an optical bimorph actuator according to some embodiments.
Figure 13:
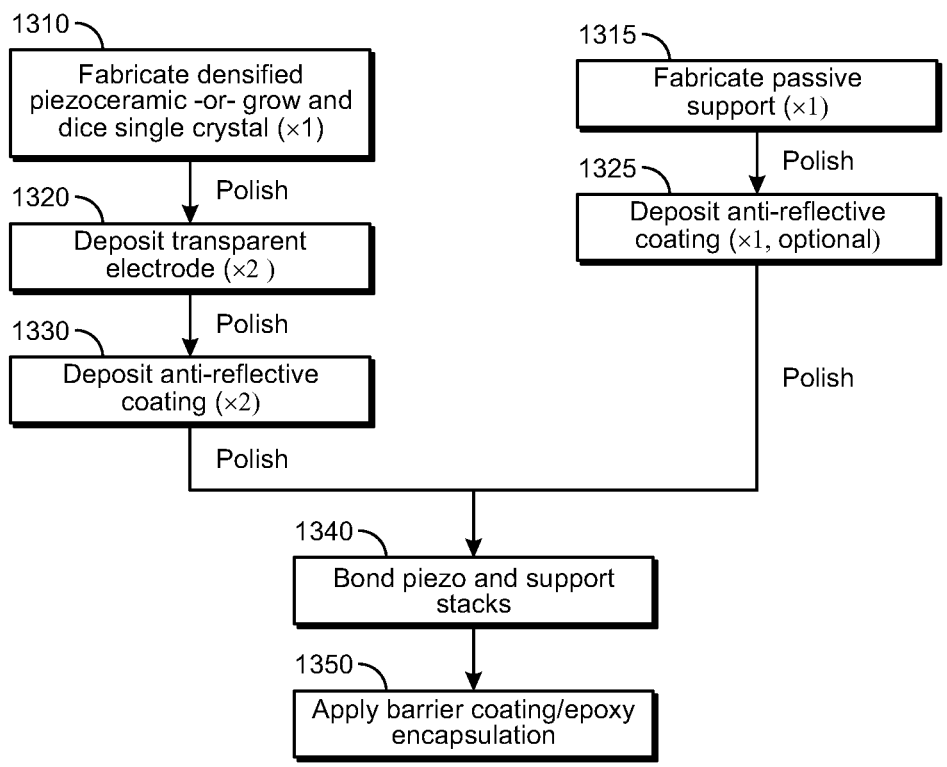
FIG. 13 illustrates an example method for fabricating an optical unimorph actuator according to some embodiments.

Example process flows for manufacturing a bimorph multilayer actuator and a unimorph multilayer actuator are shown respectively in FIGS. 12 and 13. Referring to FIG. 12, an example method may include forming a pair of electroactive ceramic layers (step 1210) and forming transparent electrodes over the major surfaces thereof (step 1220). An antireflective coating may then be formed over each transparent electrode (i.e., directly over a surface of the electrode opposite to the electroactive ceramic layer) (step 1230). A bonding layer may be used to bond the ARC/electrode/electroactive ceramic/electrode/ARC stacks (step 1240). A barrier layer may be formed over an exposed surface of the stack (step 1250). In certain embodiments, a barrier layer may be formed before or after bonding.

Referring to FIG. 13, a further example method may include forming an electroactive ceramic layer (step 1310) and forming transparent electrodes over the opposing major surfaces of the electroactive ceramic (step 1320). An antireflective coating may then be formed over each transparent electrode (i.e., directly over a surface of the electrode opposite to the electroactive ceramic layer) (step 1330). Separately, following the fabrication of a passive support (step 1315) an antireflective coating may be formed over at least one surface of the support (step 1325). A bonding layer may be used to bond the ARC/electrode/electroactive ceramic/electrode/ARC stack with the support (step 1340). A barrier layer may be formed over one or more exposed surfaces of the stack (step 1350). As in the previous method, the formation of the barrier layer(s) may precede or following the bonding step.

The electro-mechanical behavior, including the optical transmissivity (see-through performance), achievable deformation, and strain-to-failure of a tunable actuator may be improved by incorporating, in addition to an antireflective coating (ARC), one or more of a barrier layer and a bonding layer into the actuator stack. The actuator typically includes a layer of electroactive material sandwiched between conductive electrodes. The electroactive layer may include a ceramic material, for example, whereas the electrodes may each include one or more layers of any suitable conductive material(s), such as transparent conductive oxides (e.g., TCOs such as ITO), graphene, etc. An antireflective coating may be disposed over either or both electrodes and may include one or more material layers used to decrease the gradient in refractive index between the electrode and an adjacent medium, such as air, a silicone oil-containing liquid lens, or other overlying layer(s). A barrier layer may be formed over the antireflective coating as an encapsulating, environmental protection layer. A bonding layer may be incorporated into a bimorph or unimorph architecture as an adhesion-promoting layer between neighboring layers. Plural ARC layers and/or ARC layers having a compositional gradient, e.g., formed by co-deposition, may be used to moderate the refractive index gradient. In some embodiments, the ARC layer(s) may be patterned to provide a coating over a localized area and/or to include surface texture. The actuator stack may, in some embodiments, further include a passive support, which may be used to influence the mechanical performance of the actuator including its stiffness and buckling response. The multilayer actuator may be configured to withstand multiple (e.g., >$10^6$) actuation cycles and engineering strains of up to approximately 0.8%.

EXAMPLE EMBODIMENTS

Example 1: A multilayer actuator includes a primary electrode, a secondary electrode overlapping at least a portion of the primary electrode, an electroactive layer disposed between and abutting the primary electrode and the secondary electrode, a primary antireflective coating overlapping at least a portion of the primary electrode opposite the electroactive layer, a secondary antireflective coating overlapping at least a portion of the secondary electrode opposite the electroactive layer, and a barrier layer overlapping the secondary antireflective coating opposite the secondary electrode.

Example 2: The multilayer actuator of Example 1, where the electroactive layer includes an electrostrictive ceramic or a piezoelectric ceramic.

Example 3: The multilayer actuator of any of Examples 1 and 2, where the electroactive layer is a single crystal material.

Example 4: The multilayer actuator of any of Examples 1-3, where the barrier layer includes an epoxy compound and is disposed directly over the secondary antireflective coating.

Example 5: The multilayer actuator of any of Examples 1-4, further including a bonding layer disposed directly over the primary antireflective coating opposite the primary electrode.

Example 6: The multilayer actuator of Example 5, where the bonding layer includes a pressure sensitive adhesive.

Example 7: The multilayer actuator of any of Examples 5 and 6, further including a transparent support disposed directly over the bonding layer opposite the primary antireflective coating.

Example 8: The multilayer actuator of Example 7, where the transparent support includes a material selected from plastic, glass, ceramic, and sapphire.

Example 9: The multilayer actuator of any of Examples 7 and 8, further including a tertiary antireflective coating disposed directly over a surface of the transparent support.

Example 10: The multilayer actuator of Example 9, further including a second barrier layer overlapping the tertiary antireflective coating opposite the transparent support.

Example 11: The multilayer actuator of any of Examples 5 and 6, further including (from top to bottom) a tertiary antireflective coating disposed directly over the bonding layer, a tertiary electrode, a second electroactive layer, a quaternary electrode, and a quaternary antireflective coating.

Example 12: A head-mounted display including the multilayer actuator of any of Examples 1-11.

Example 13: A multilayer actuator includes a bonding layer, a primary antireflective coating disposed over and contacting the bonding layer, a primary electrode disposed over and contacting the primary antireflective coating, an electroactive layer disposed over and contacting the primary electrode, a secondary electrode disposed over and contacting the electroactive layer, a secondary antireflective coating disposed over and contacting the secondary electrode, and a barrier layer disposed over and contacting the secondary antireflective coating, where the bonding layer includes a pressure sensitive adhesive and the barrier layer includes an epoxy compound.

Example 14: The multilayer actuator of Example 13, where the bonding layer includes an acrylate-based polymer.

Example 15: The multilayer actuator of any of Examples 13 and 14, where the bonding layer and the barrier layer each respectively include a transparent layer.

Example 16: The multilayer actuator of any of Examples 13-15, further including a transparent support disposed directly over the bonding layer opposite the primary antireflective coating.

Example 17: A method includes: forming an electroactive layer, forming a primary electrode over a first surface of the electroactive layer, forming a secondary electrode over a second surface of the electroactive layer, forming a primary antireflective coating over the primary electrode, forming a secondary antireflective coating over the secondary electrode, forming a bonding layer over the primary antireflective coating, and forming a barrier layer over the secondary antireflective coating.

Example 18: The method of Example 17, where the bonding layer includes an acrylate-based polymer and the barrier layer includes an epoxy compound.

Example 19: The method of any of Example 17 and 18, further including forming a tertiary antireflective coating over the barrier layer opposite to the primary antireflective coating.

Example 20: The method of any of Examples 17 and 18, further including affixing a transparent support to the bonding layer.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 1400 in FIG. 14) or that visually immerses a user in an artificial reality (e.g., virtual-reality system 1500 in FIG. 15). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 14:
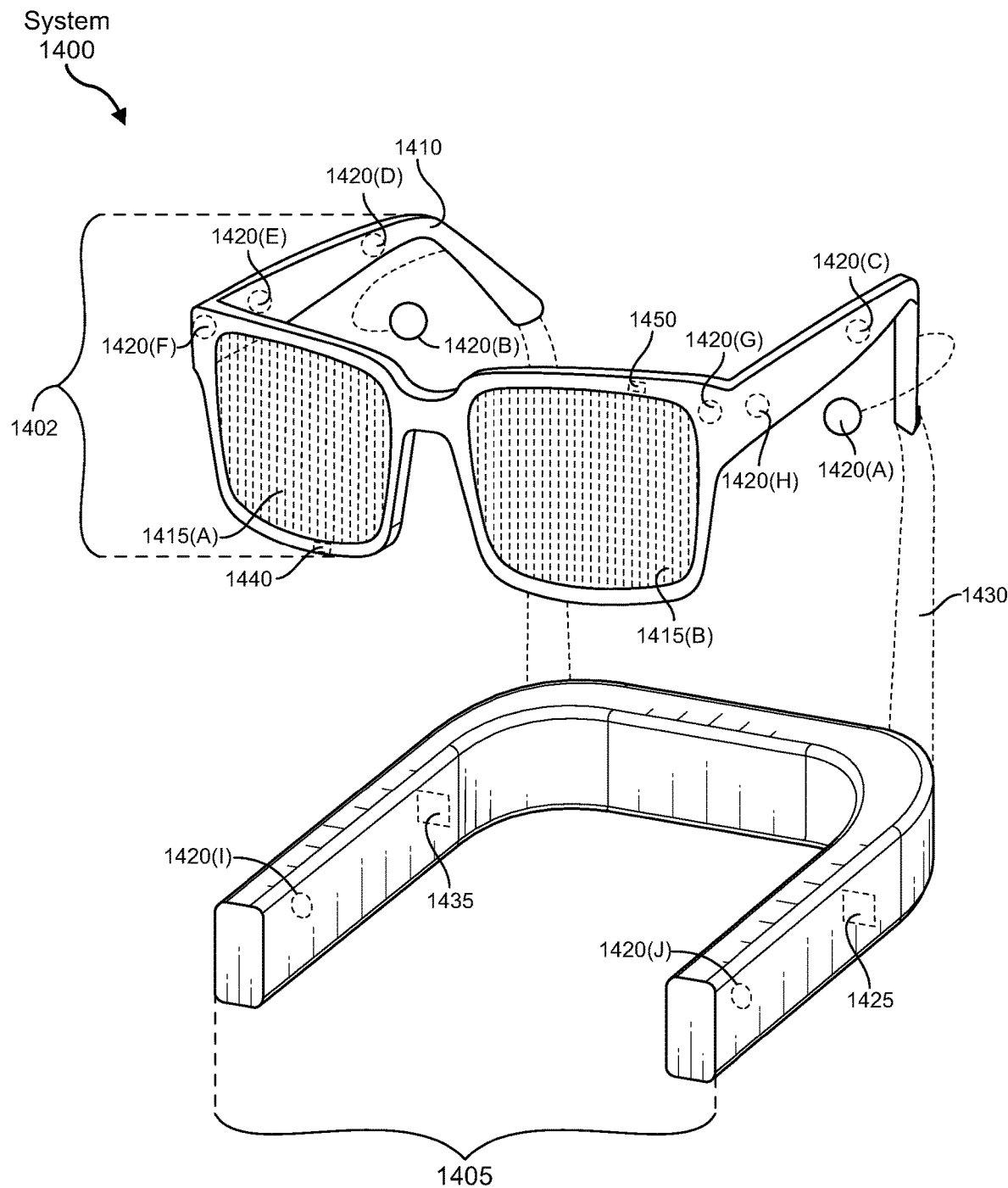
FIG. 14 is an illustration of exemplary augmented-reality glasses that may be used in connection with embodiments of this disclosure.

Turning to FIG. 14, augmented-reality system 1400 may include an eyewear device 1402 with a frame 1410 configured to hold a left display device 1415(A) and a right display device 1415(B) in front of a user's eyes. Display devices 1415(A) and 1415(B) may act together or independently to present an image or series of images to a user. While augmented-reality system 1400 includes two displays, embodiments of this disclosure may be implemented in augmented-reality systems with a single NED or more than two NEDs.

In some embodiments, augmented-reality system 1400 may include one or more sensors, such as sensor 1440. Sensor 1440 may generate measurement signals in response to motion of augmented-reality system 1400 and may be located on substantially any portion of frame 1410. Sensor 1440 may represent a position sensor, an inertial measurement unit (IMU), a depth camera assembly, a structured light emitter and/or detector, or any combination thereof. In some embodiments, augmented-reality system 1400 may or may not include sensor 1440 or may include more than one sensor. In embodiments in which sensor 1440 includes an IMU, the IMU may generate calibration data based on measurement signals from sensor 1440. Examples of sensor 1440 may include, without limitation, accelerometers, gyroscopes, magnetometers, other suitable types of sensors that detect motion, sensors used for error correction of the IMU, or some combination thereof.

Augmented-reality system 1400 may also include a microphone array with a plurality of acoustic transducers 1420(A)-1420(J), referred to collectively as acoustic transducers 1420. Acoustic transducers 1420 may be transducers that detect air pressure variations induced by sound waves. Each acoustic transducer 1420 may be configured to detect sound and convert the detected sound into an electronic format (e.g., an analog or digital format). The microphone array in FIG. 2 may include, for example, ten acoustic transducers: 1420(A) and 1420(B), which may be designed to be placed inside a corresponding ear of the user, acoustic transducers 1420(C), 1420(D), 1420(E), 1420(F), 1420(G), and 1420(H), which may be positioned at various locations on frame 1410, and/or acoustic transducers 1420(I) and 1420(J), which may be positioned on a corresponding neckband 1405.

In some embodiments, one or more of acoustic transducers 1420(A)-(F) may be used as output transducers (e.g., speakers). For example, acoustic transducers 1420(A) and/or 1420(B) may be earbuds or any other suitable type of headphone or speaker.

The configuration of acoustic transducers 1420 of the microphone array may vary. While augmented-reality system 1400 is shown in FIG. 14 as having ten acoustic transducers 1420, the number of acoustic transducers 1420 may be greater or less than ten. In some embodiments, using higher numbers of acoustic transducers 1420 may increase the amount of audio information collected and/or the sensitivity and accuracy of the audio information. In contrast, using a lower number of acoustic transducers 1420 may decrease the computing power required by an associated controller 1450 to process the collected audio information. In addition, the position of each acoustic transducer 1420 of the microphone array may vary. For example, the position of an acoustic transducer 1420 may include a defined position on the user, a defined coordinate on frame 1410, an orientation associated with each acoustic transducer 1420, or some combination thereof.

Acoustic transducers 1420(A) and 1420(B) may be positioned on different parts of the user's ear, such as behind the pinna, behind the tragus, and/or within the auricle or fossa. Or, there may be additional acoustic transducers 1420 on or surrounding the ear in addition to acoustic transducers 1420 inside the ear canal. Having an acoustic transducer 1420 positioned next to an ear canal of a user may enable the microphone array to collect information on how sounds arrive at the ear canal. By positioning at least two of acoustic transducers 1420 on either side of a user's head (e.g., as binaural microphones), augmented-reality device 1400 may simulate binaural hearing and capture a 3D stereo sound field around about a user's head. In some embodiments, acoustic transducers 1420(A) and 1420(B) may be connected to augmented-reality system 1400 via a wired connection 1430, and in other embodiments acoustic transducers 1420(A) and 1420(B) may be connected to augmented-reality system 1400 via a wireless connection (e.g., a Bluetooth connection). In still other embodiments, acoustic transducers 1420(A) and 1420(B) may not be used at all in conjunction with augmented-reality system 1400.

Acoustic transducers 1420 on frame 1410 may be positioned along the length of the temples, across the bridge, above or below display devices 1415(A) and 1415(B), or some combination thereof. Acoustic transducers 1420 may be oriented such that the microphone array is able to detect sounds in a wide range of directions surrounding the user wearing the augmented-reality system 1400. In some embodiments, an optimization process may be performed during manufacturing of augmented-reality system 1400 to determine relative positioning of each acoustic transducer 1420 in the microphone array.

In some examples, augmented-reality system 1400 may include or be connected to an external device (e.g., a paired device), such as neckband 1405. Neckband 1405 generally represents any type or form of paired device. Thus, the following discussion of neckband 1405 may also apply to various other paired devices, such as charging cases, smart watches, smart phones, wrist bands, other wearable devices, hand-held controllers, tablet computers, laptop computers, other external compute devices, etc.

As shown, neckband 1405 may be coupled to eyewear device 1402 via one or more connectors. The connectors may be wired or wireless and may include electrical and/or non-electrical (e.g., structural) components. In some cases, eyewear device 1402 and neckband 1405 may operate independently without any wired or wireless connection between them. While FIG. 14 illustrates the components of eyewear device 1402 and neckband 1405 in example locations on eyewear device 1402 and neckband 1405, the components may be located elsewhere and/or distributed differently on eyewear device 1402 and/or neckband 1405. In some embodiments, the components of eyewear device 1402 and neckband 1405 may be located on one or more additional peripheral devices paired with eyewear device 1402, neckband 1405, or some combination thereof.

Pairing external devices, such as neckband 1405, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1400 may be provided by a paired device or shared between a paired device and an eyewear device, thus reducing the weight, heat profile, and form factor of the eyewear device overall while still retaining desired functionality. For example, neckband 1405 may allow components that would otherwise be included on an eyewear device to be included in neckband 1405 since users may tolerate a heavier weight load on their shoulders than they would tolerate on their heads. Neckband 1405 may also have a larger surface area over which to diffuse and disperse heat to the ambient environment. Thus, neckband 1405 may allow for greater battery and computation capacity than might otherwise have been possible on a stand-alone eyewear device. Since weight carried in neckband 1405 may be less invasive to a user than weight carried in eyewear device 1402, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1405 may be communicatively coupled with eyewear device 1402 and/or to other devices. These other devices may provide certain functions (e.g., tracking, localizing, depth mapping, processing, storage, etc.) to augmented-reality system 1400. In the embodiment of FIG. 14, neckband 1405 may include two acoustic transducers (e.g., 1420(I) and 1420(J)) that are part of the microphone array (or potentially form their own microphone subarray). Neckband 1405 may also include a controller 1425 and a power source 1435.

Acoustic transducers 1420(I) and 1420(J) of neckband 1405 may be configured to detect sound and convert the detected sound into an electronic format (analog or digital). In the embodiment of FIG. 14, acoustic transducers 1420(I) and 1420(J) may be positioned on neckband 1405, thereby increasing the distance between the neckband acoustic transducers 1420(I) and 1420(J) and other acoustic transducers 1420 positioned on eyewear device 1402. In some cases, increasing the distance between acoustic transducers 1420 of the microphone array may improve the accuracy of beamforming performed via the microphone array. For example, if a sound is detected by acoustic transducers 1420(C) and 1420(D) and the distance between acoustic transducers 1420(C) and 1420(D) is greater than, e.g., the distance between acoustic transducers 1420(D) and 1420(E), the determined source location of the detected sound may be more accurate than if the sound had been detected by acoustic transducers 1420(D) and 1420(E).

Controller 1425 of neckband 1405 may process information generated by the sensors on neckband 1405 and/or augmented-reality system 1400. For example, controller 1425 may process information from the microphone array that describes sounds detected by the microphone array. For each detected sound, controller 1425 may perform a direction-of-arrival (DOA) estimation to estimate a direction from which the detected sound arrived at the microphone array. As the microphone array detects sounds, controller 1425 may populate an audio data set with the information. In embodiments in which augmented-reality system 1400 includes an inertial measurement unit, controller 1425 may compute all inertial and spatial calculations from the IMU located on eyewear device 1402. A connector may convey information between augmented-reality system 1400 and neckband 1405 and between augmented-reality system 1400 and controller 1425. The information may be in the form of optical data, electrical data, wireless data, or any other transmittable data form. Moving the processing of information generated by augmented-reality system 1400 to neckband 1405 may reduce weight and heat in eyewear device 1402, making it more comfortable to the user.

Power source 1435 in neckband 1405 may provide power to eyewear device 1402 and/or to neckband 1405. Power source 1435 may include, without limitation, lithium ion batteries, lithium-polymer batteries, primary lithium batteries, alkaline batteries, or any other form of power storage. In some cases, power source 1435 may be a wired power source. Including power source 1435 on neckband 1405 instead of on eyewear device 1402 may help better distribute the weight and heat generated by power source 1435.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1500 in FIG. 15, that mostly or completely covers a user's field of view. Virtual-reality system 1500 may include a front rigid body 1502 and a band 1504 shaped to fit around a user's head. Virtual-reality system 1500 may also include output audio transducers 1506(A) and 1506(B). Furthermore, while not shown in FIG. 15, front rigid body 1502 may include one or more electronic elements, including one or more electronic displays, one or more inertial measurement units (IMUs), one or more tracking emitters or detectors, and/or any other suitable device or system for creating an artificial reality experience.

Artificial-reality systems may include a variety of types of visual feedback mechanisms. For example, display devices in augmented-reality system 1400 and/or virtual-reality system 1500 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial-reality systems may include one or more projection systems. For example, display devices in augmented-reality system 1400 and/or virtual-reality system 1500 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

Artificial-reality systems may also include various types of computer vision components and subsystems. For example, augmented-reality system 1400 and/or virtual-reality system 1500 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIG. 14, output audio transducers 1506(A) and 1506(B) may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

While not shown in FIG. 14, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

As noted, artificial-reality systems 1400 and 1500 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 16:
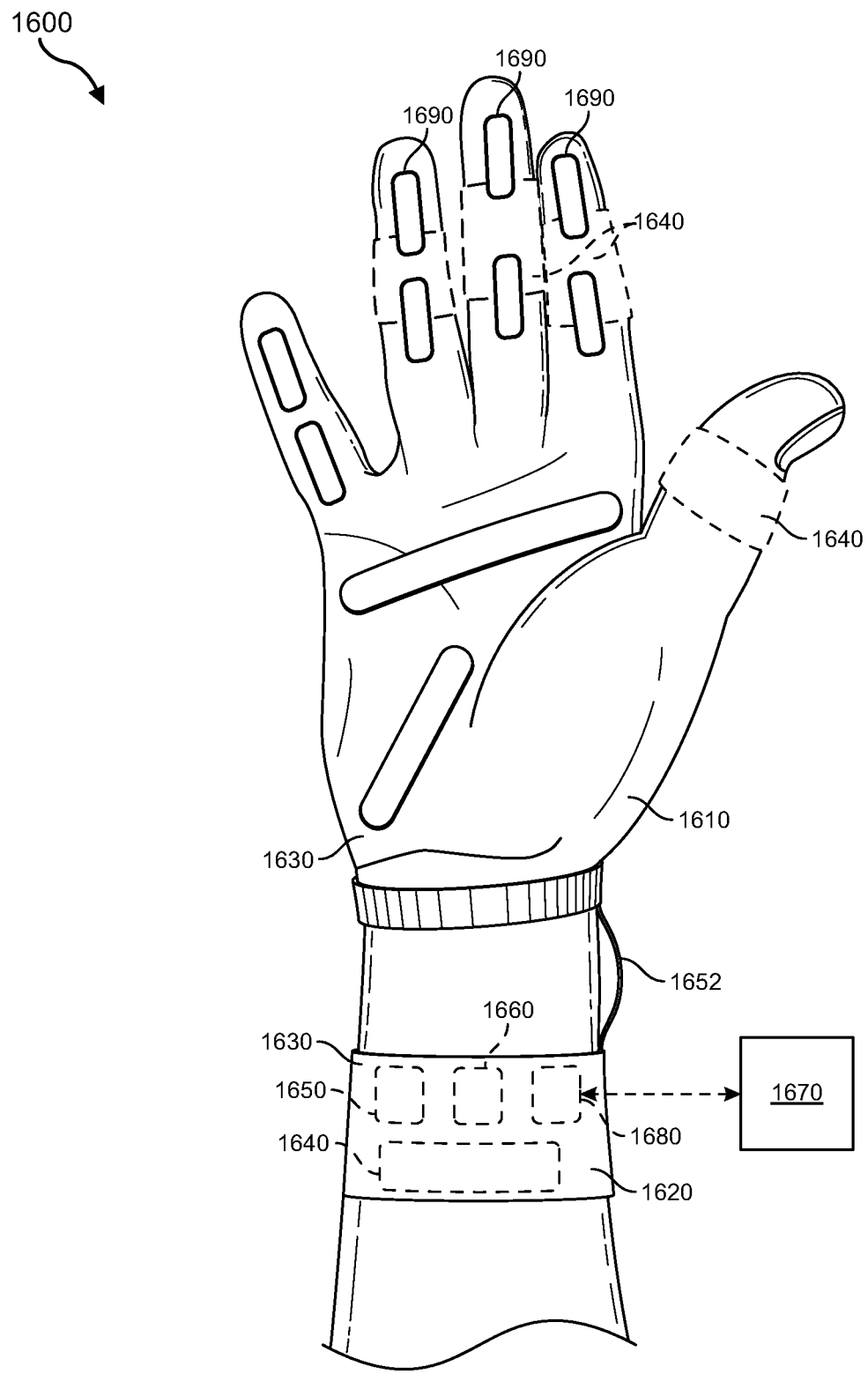
FIG. 16 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 16 illustrates a vibrotactile system 1600 in the form of a wearable glove (haptic device 1610) and wristband (haptic device 1620). Haptic device 1610 and haptic device 1620 are shown as examples of wearable devices that include a flexible, wearable textile material 1630 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1640 may be positioned at least partially within one or more corresponding pockets formed in textile material 1630 of vibrotactile system 1600. Vibrotactile devices 1640 may be positioned in locations to provide a vibrating sensation (e.g., haptic feedback) to a user of vibrotactile system 1600. For example, vibrotactile devices 1640 may be positioned against the user's finger(s), thumb, or wrist, as shown in FIG. 16. Vibrotactile devices 1640 may, in some examples, be sufficiently flexible to conform to or bend with the user's corresponding body part(s).

A power source 1650 (e.g., a battery) for applying a voltage to the vibrotactile devices 1640 for activation thereof may be electrically coupled to vibrotactile devices 1640, such as via conductive wiring 1652. In some examples, each of vibrotactile devices 1640 may be independently electrically coupled to power source 1650 for individual activation. In some embodiments, a processor 1660 may be operatively coupled to power source 1650 and configured (e.g., programmed) to control activation of vibrotactile devices 1640.

Vibrotactile system 1600 may be implemented in a variety of ways. In some examples, vibrotactile system 1600 may be a standalone system with integral subsystems and components for operation independent of other devices and systems. As another example, vibrotactile system 1600 may be configured for interaction with another device or system 1670. For example, vibrotactile system 1600 may, in some examples, include a communications interface 1680 for receiving and/or sending signals to the other device or system 1670. The other device or system 1670 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1680 may enable communications between vibrotactile system 1600 and the other device or system 1670 via a wireless (e.g., Wi-Fi, Bluetooth, cellular, radio, etc.) link or a wired link. If present, communications interface 1680 may be in communication with processor 1660, such as to provide a signal to processor 1660 to activate or deactivate one or more of the vibrotactile devices 1640.

Vibrotactile system 1600 may optionally include other subsystems and components, such as touch-sensitive pads 1690, pressure sensors, motion sensors, position sensors, lighting elements, and/or user interface elements (e.g., an on/off button, a vibration control element, etc.). During use, vibrotactile devices 1640 may be configured to be activated for a variety of different reasons, such as in response to the user's interaction with user interface elements, a signal from the motion or position sensors, a signal from the touch-sensitive pads 1690, a signal from the pressure sensors, a signal from the other device or system 1670, etc.

Although power source 1650, processor 1660, and communications interface 1680 are illustrated in FIG. 16 as being positioned in haptic device 1620, the present disclosure is not so limited. For example, one or more of power source 1650, processor 1660, or communications interface 1680 may be positioned within haptic device 1610 or within another wearable textile.

Figure 17:
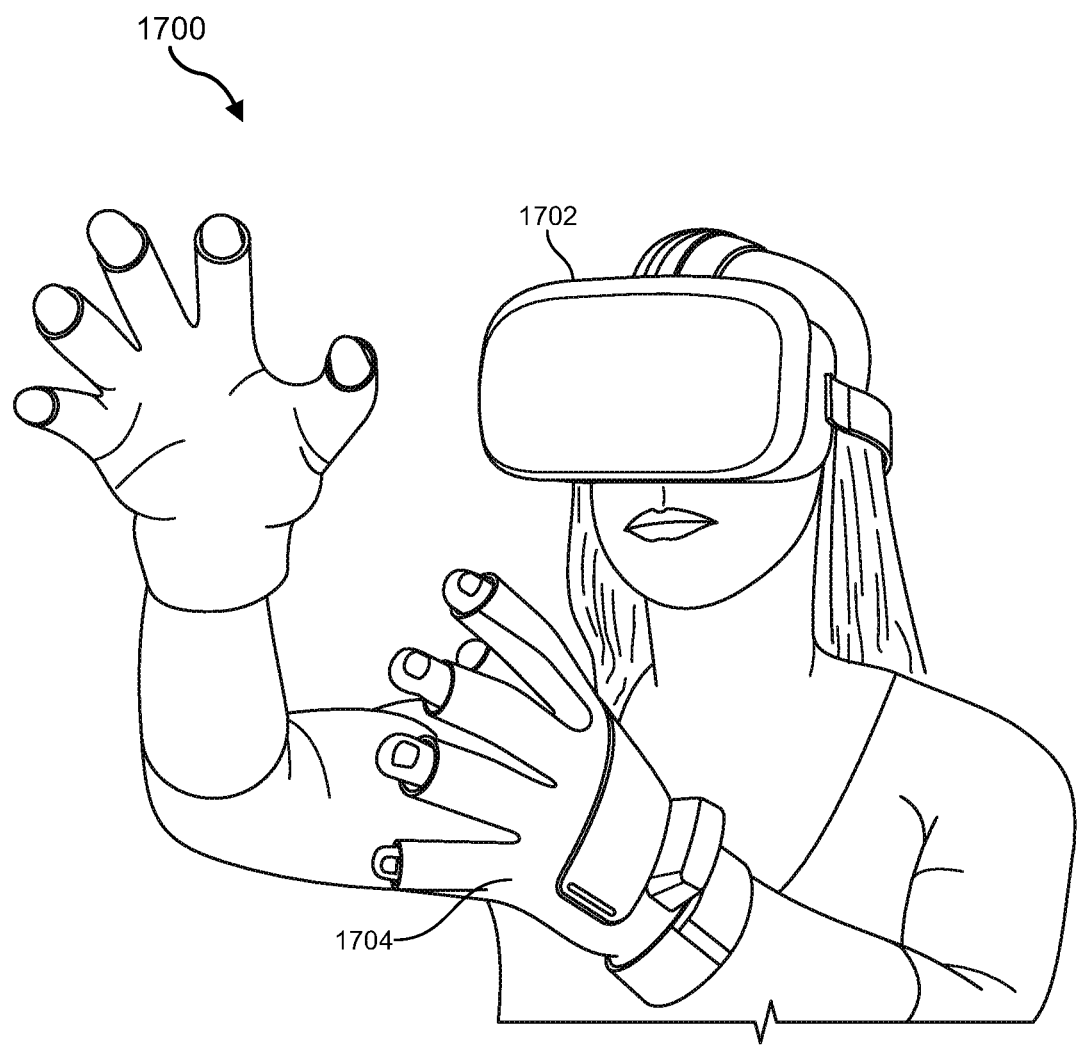
FIG. 17 is an illustration of an exemplary virtual-reality environment according to embodiments of this disclosure.

Haptic wearables, such as those shown in and described in connection with FIG. 16, may be implemented in a variety of types of artificial-reality systems and environments. FIG. 17 shows an example artificial-reality environment 1700 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 15:
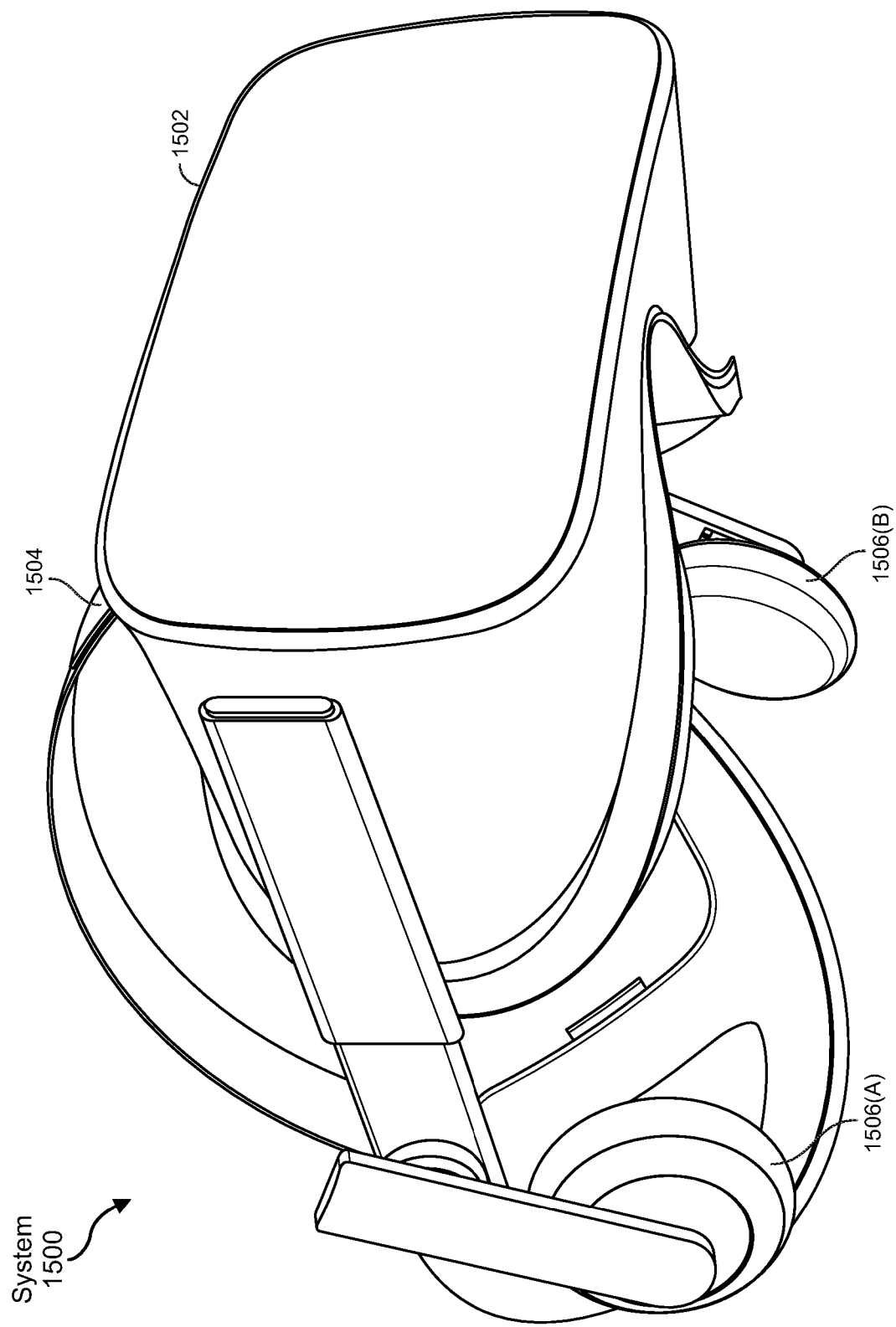
FIG. 15 is an illustration of an exemplary virtual-reality headset that may be used in connection with embodiments of this disclosure.

Head-mounted display 1702 generally represents any type or form of virtual-reality system, such as virtual-reality system 1500 in FIG. 15. Haptic device 1704 generally represents any type or form of wearable device, worn by a user of an artificial-reality system, that provides haptic feedback to the user to give the user the perception that he or she is physically engaging with a virtual object. In some embodiments, haptic device 1704 may provide haptic feedback by applying vibration, motion, and/or force to the user. For example, haptic device 1704 may limit or augment a user's movement. To give a specific example, haptic device 1704 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 1704 to send action requests to a console. Examples of action requests include, without limitation, requests to start an application and/or end the application and/or requests to perform a particular action within the application.

Figure 18:
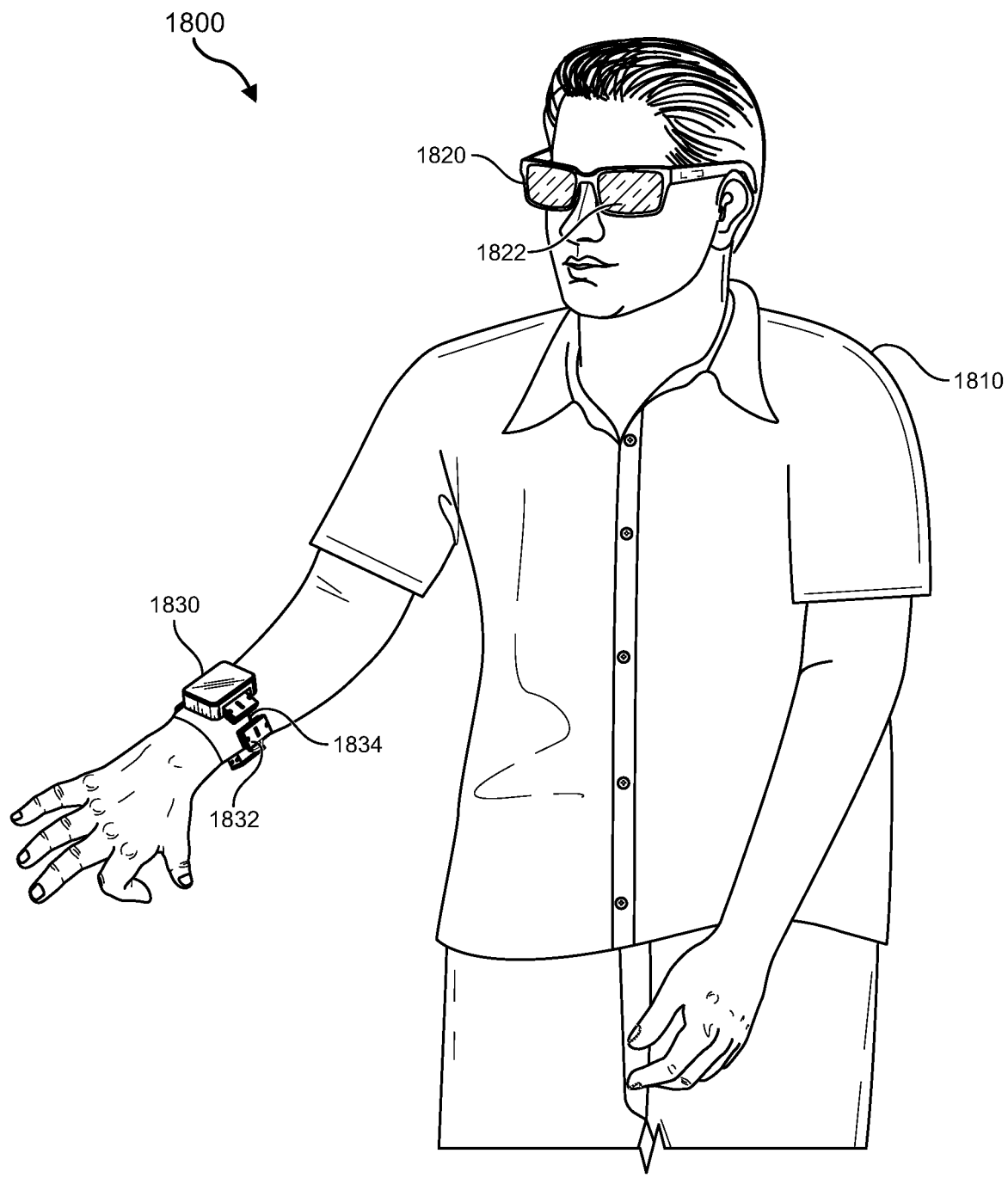
FIG. 18 is an illustration of an exemplary augmented-reality environment according to embodiments of this disclosure.

While haptic interfaces may be used with virtual-reality systems, as shown in FIG. 17, haptic interfaces may also be used with augmented-reality systems, as shown in FIG. 18. FIG. 18 is a perspective view of a user 1810 interacting with an augmented-reality system 1800. In this example, user 1810 may wear a pair of augmented-reality glasses 1820 that may have one or more displays 1822 and that are paired with a haptic device 1830. In this example, haptic device 1830 may be a wristband that includes a plurality of band elements 1832 and a tensioning mechanism 1834 that connects band elements 1832 to one another.

One or more of band elements 1832 may include any type or form of actuator suitable for providing haptic feedback. For example, one or more of band elements 1832 may be configured to provide one or more of various types of cutaneous feedback, including vibration, force, traction, texture, and/or temperature. To provide such feedback, band elements 1832 may include one or more of various types of actuators. In one example, each of band elements 1832 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1610, 1620, 1704, and 1830 may include any suitable number and/or type of haptic transducer, sensor, and/or feedback mechanism. For example, haptic devices 1610, 1620, 1704, and 1830 may include one or more mechanical transducers, piezoelectric transducers, and/or fluidic transducers. Haptic devices 1610, 1620, 1704, and 1830 may also include various combinations of different types and forms of transducers that work together or independently to enhance a user's artificial-reality experience. In one example, each of band elements 1832 of haptic device 1830 may include a vibrotactor (e.g., a vibrotactile actuator) configured to vibrate in unison or independently to provide one or more of various types of haptic sensations to a user.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A multilayer actuator comprising:
   a first barrier layer;
   a first primary antireflective coating directly contacting the first barrier layer, wherein the first primary antireflective coating is a single layer comprising a refractive index gradient;
   a first primary electrode directly contacting the first primary antireflective coating;
   a first electroactive layer directly contacting the first primary electrode;
   a first secondary electrode directly contacting the first electroactive layer; and
   a first secondary antireflective coating directly contacting the first secondary electrode.

2. The multilayer actuator of claim 1, wherein the first electroactive layer comprises an electrostrictive ceramic or a piezoelectric ceramic.

3. The multilayer actuator of claim 1, wherein the first electroactive layer comprises a single crystal material.

4. The multilayer actuator of claim 1, wherein the first barrier layer comprises an epoxy compound.

5. The multilayer actuator of claim 1, further comprising a bonding layer disposed directly over the first secondary antireflective coating.

6. The multilayer actuator of claim 5, further comprising from bottom to top:
   a second primary antireflective coating disposed directly over the bonding layer;
   a second primary electrode;
   a second electroactive layer;
   a second secondary electrode; and
   a second secondary antireflective coating.

7. The multilayer actuator of claim 5, wherein the bonding layer comprises a pressure sensitive adhesive.

8. The multilayer actuator of claim 5, further comprising a transparent support disposed directly over the bonding layer.

9. The multilayer actuator of claim 8, wherein the transparent support comprises a material selected from a group consisting of plastic, glass, ceramic, and sapphire.

10. The multilayer actuator of claim 8, further comprising a second primary antireflective coating disposed directly over a surface of the transparent support.

11. The multilayer actuator of claim 10, further comprising a second barrier layer disposed directly over a second secondary antireflective coating.

12. A head-mounted display comprising the multilayer actuator of claim 1.

13. A multilayer actuator comprising:
   a bonding layer;
   a primary antireflective coating disposed over and directly contacting the bonding layer, wherein the primary antireflective coating is a single layer comprising a refractive index gradient;
   a primary electrode disposed over and directly contacting the primary antireflective coating;
   an electroactive layer disposed over and directly contacting the primary electrode;
   a secondary electrode disposed over and directly contacting the electroactive layer;
   a secondary antireflective coating disposed over and directly contacting the secondary electrode; and
   a barrier layer disposed over and directly contacting the secondary antireflective coating, wherein the bonding layer comprises a pressure sensitive adhesive and the barrier layer comprises an epoxy compound.

14. The multilayer actuator of claim 13, wherein the bonding layer comprises an acrylate-based polymer.

15. The multilayer actuator of claim 13, wherein the bonding layer and the barrier layer each respectively comprise a transparent layer.

16. The multilayer actuator of claim 13, further comprising a transparent support disposed directly over the bonding layer.

17. A method comprising:
   forming an electroactive layer;
   forming a first primary electrode directly contacting a first surface of the electroactive layer;
   forming a first secondary electrode over a second surface of the electroactive layer;
   forming a first primary antireflective coating directly contacting the first primary electrode, wherein the first primary antireflective coating is a single layer comprising a refractive index gradient;
   forming a first secondary antireflective coating disposed over and directly contacting the first secondary electrode;
   forming a bonding layer over the first secondary antireflective coating; and
   forming a barrier layer directly contacting the first primary antireflective coating.

18. The method of claim 17, wherein the bonding layer comprises an acrylate-based polymer and the barrier layer comprises an epoxy compound.

19. The method of claim 17, further comprising forming a second primary antireflective coating directly contacting the bonding layer.

20. The method of claim 17, further comprising affixing a transparent support to the bonding layer.

* * * * *